(12) United States Patent
Mala et al.

(10) Patent No.: US 7,443,569 B2
(45) Date of Patent: Oct. 28, 2008

(54) MICRO-ELECTRO-MECHANICAL-SYSTEM TWO DIMENSIONAL MIRROR WITH ARTICULATED SUSPENSION STRUCTURES FOR HIGH FILL FACTOR ARRAYS

(75) Inventors: Mohiuddin Mala, Kanata (CA); Thomas Ducellier, Ottawa (CA); Alan Hnatiw, Stittsville (CA)

(73) Assignee: JDS Uniphase Corporation, Milpitas, CA (US)

( * ) Notice: Subject to any disclaimer, the term of this patent is extended or adjusted under 35 U.S.C. 154(b) by 120 days.

(21) Appl. No.: 11/505,378

(22) Filed: Aug. 17, 2006

(65) Prior Publication Data
US 2007/0058238 A1    Mar. 15, 2007

Related U.S. Application Data

(63) Continuation-in-part of application No. 10/827,252, filed on Apr. 20, 2004, now Pat. No. 7,095,546.

(60) Provisional application No. 60/464,972, filed on Apr. 24, 2003.

(51) Int. Cl.
*G02B 26/00* (2006.01)
*G02B 26/08* (2006.01)

(52) U.S. Cl. .................. 359/290; 359/224; 359/198

(58) Field of Classification Search .............. 359/198, 359/224, 225, 290, 295, 298
See application file for complete search history.

(56) References Cited

U.S. PATENT DOCUMENTS 6,431,714 B1 *   8/2002   Sawada et al. .............. 359/879

* cited by examiner

*Primary Examiner*—William C Choi
(74) *Attorney, Agent, or Firm*—Teitelbaum & MacLean; Neil Teitelbaum; Doug MacLean

(57) ABSTRACT

The invention provides a micro-electro-mechanical-system (MEMS) mirror device, comprising: a mirror having a 2-dimensional rotational T-shaped hinge at a first end, and having a flexible connection at a second end opposite the first end. The invention also provides a MEMS mirror device, comprising: a mirror having a 2-dimensional rotational T-shaped hinge at a first end; and a vertical actuator connected to the 2-dimensional T-shaped hinge through a rigid connection. The invention also provides a MEMS mirror device, comprising: a mirror connected to a first end of a rotational actuator through bending springs at a first end, and having a torsional spring at a second end opposite the first end; a movable cantilever connected to the mirror through the torsional spring; and a support structure connected to the first end and a second end of the rotational actuator through torsional springs and connected to the movable cantilever.

50 Claims, 23 Drawing Sheets

MICRO-ELECTRO-MECHANICAL-SYSTEM TWO DIMENSIONAL MIRROR WITH ARTICULATED SUSPENSION STRUCTURES FOR HIGH FILL FACTOR ARRAYS

RELATED APPLICATION

This application claims the benefit of, and is a continuation in part of, prior U.S. application Ser. No. 10/827,252 filed Apr. 20, 2004 now U.S. Pat. No. 7,095,546. This application also claims the benefit of prior U.S. provisional application Ser. No. 60/464,972 filed Apr. 24, 2003.

FIELD OF THE INVENTION

The invention relates to a MEMS (micro-electro-mechanical-system) two dimensional mirror with articulated suspension structures for high fill factor arrays.

BACKGROUND OF THE INVENTION

A MEMS (Micro-Electro-Mechanical-System) device is a micro-sized mechanical structure having electrical circuitry fabricated together with the device by various microfabrication processes mostly derived from integrated circuit fabrication methods. The developments in the field of microelectromechanical systems (MEMS) allow for the bulk/batch production of microelectromechanical mirrors and mirror arrays that can be used in all-optical cross connect switches, 1×N, N×N optical switches, attenuators etc. A number of microelectromechanical mirror arrays have already been built using MEMS production processes and techniques. These arrays have designs that fall into approximately three design categories.

A first category consists of conventional 2D gimbal mirrors with each mirror surrounded by a frame. The conventional 2D gimbal mirror is one of the most common types of MEMS 2D micromirrors. An example is shown in FIG. 6. It consists of a central mirror 10 that is connected to an outer frame 12 with torsional hinges 14. The outer frame 12 is in turn connected to the support structure 16 with another set of torsional hinges 18. There are four electrodes under the central mirror 10 that can be actuated resulting in a 2D tilt of the mirror-frame assembly. One such device is disclosed under U.S. Patent Application Publication No: U.S. 2002/0071169 A1, publication date Jun. 13, 2002. One of the shortcomings of this design is the inability to achieve high fill factors (that is the spacing between two consecutive mirrors or the ratio of the active area to the total area in an array) in a mirror array. An example of a high fill factor would be >90% active mirror portion along one dimension.

A second category consists of 2D/3D mirrors with hidden hinge structures. With significant advances made in Spatial Light Modulators, a number of 2D micromirror devices have been designed with various types of hidden hinge structure. Examples of these are disclosed in U.S. Pat. Nos. 5,535,047, 5,661,591, U.S. Pat. No. 6,480,320 B2.

A schematic of an example of such a device is shown in FIG. 7. Although this device structure can yield high fill factor arrays, the fabrication processes are very complex. For more discussion on the Spatial Light Modulators and Digital Mirror devices with hidden hinge structure, references are made to U.S. Pat. Nos. 5,061,049, 5,079,545, 5,105,369, 5,278,652, 4,662,746, 4,710,732, 4,956,619, 5,172,262, and 5,083,857.

A third category consists of 2D mirrors each mounted on a single moving flexible post. An example of a MEMS tilt platform supported by a flexible post 30 is shown in FIG. 8. The post 30 extends within a moat 32 or trench formed in the substrate or supporting material 34. The post 30 can be made sufficiently long and flexible to act as an omnidirectional hinge, bending to allow the mirror 36 to be positioned with two degrees of freedom.

Some of the shortcomings of this design are process complexity, post flexibility, wiring, and tilt eccentricity. A few of such devices have been disclosed in U.S. Pat. No. 5,469,302, U.S. Patent Application Publication No. U.S. 2002/0075554 A1. Furthermore, the control for these devices becomes complex and is a substantial part of the device cost.

SUMMARY OF THE INVENTION

Some of the advantages realized in some but not necessarily all embodiments include:

high fill factor linear arrays. Fill factors as high as 99% may be achieved in some embodiments along one dimension;

almost negligible mechanical coupling between two tilt axes;

almost negligible electromechanical coupling between two tilt axes;

inexpensive and simple control. Even an open loop/look up table control is a possibility;

simple fabrication process can be used to fabricate the device; and the cantilever part of the device can also be used for capacitive, magnetic or optical sensing of mirror position.

In some embodiments, each torsional spring comprises a respective beam having a large thickness to width aspect ratio.

In some embodiments, each torsional spring comprises a respective beam having a large thickness to width aspect ratio, the beam being formed of a material or materials selected from a group consisting of Silicon, Polysilicon, Silicon Nitride, Silicon dioxide, and metallic depositable materials.

In some embodiments, the beams are formed of a unitary construction.

In some embodiments, the beams and the mirror are formed of a unitary construction.

In some embodiments, the beams comprise articulated beams.

In some embodiments, the mirror has an angular range of motion at least 0.3 degrees in each axis.

In some embodiments, the device further comprises electrodes for applying electrostatic force to the mirror so as to move the mirror in at least one of the first and second axes of rotation.

In some embodiments, the electrodes comprise two electrodes each for applying a respective electrostatic force to the mirror so as to move the mirror in a respective direction in the second axis of rotation, and at least one electrode for applying electrostatic force to the mirror so as to move the mirror in the first rotational axis.

In some embodiments, the at least one electrode comprises at least one electrode mounted on the support structure proximal at least one of the first end of the mirror and a second end of the mirror opposite the first end of the mirror for applying a respective electrostatic force to the mirror so as to move the mirror in the first rotational axis.

In some embodiments, the device further comprises a vertical actuator connected to the 2-dimensional rotational T-shaped hinge through a rigid connection; whereby movement of the vertical actuator causes rotation of the mirror in the first axis of rotation;

In some embodiments, the beams, the vertical actuator and the mirror are formed of a unitary construction.

In some embodiments, the device further comprises at least one electrode mounted on the support structure beneath the vertical actuator for applying a respective electrostatic force to the vertical actuator so as to move the mirror in the first rotational axis.

In some embodiments, the device further comprises a flexible connection that is connected to the support structure and to a second end of the mirror that is opposite the first end of the mirror.

In some embodiments, the flexible connection comprises a torsional spring and at least one bending spring.

In some embodiments, the beams, the bending spring and the mirror are formed of a unitary construction.

In some embodiments, the device further comprises at least one restraining support for limiting movement of the mirror.

In some embodiments, the flexible connection comprises a T-shaped hinge comprising one torsional spring and two bending springs.

In some embodiments, the flexible connection comprises a torsional spring and a bending spring comprising a series of connected rectangles of diminishing size.

In some embodiments, the at least one bending spring comprises a rectangular spiral spring.

In some embodiments, the at least one bending spring comprises a connected concentric spiral beam spring comprising connected concentric beams, wherein adjacent concentric beams are connected together at only one point.

In some embodiments, the connected concentric spiral beam spring is circular.

In some embodiments, the connected concentric spiral beam spring is rectangular.

In some embodiments, a center of the connected concentric spiral beam spring is offset from the second torsional axis of rotation.

In some embodiments, the at least one bending spring comprises a first connected concentric spiral beam spring and a second connected concentric spiral beam spring each comprising connected concentric beams, wherein adjacent concentric beams are connected together at only one point, and wherein respective centers of the first and the second connected concentric spiral beam springs are located on opposite sides of the second torsional axis of rotation and are equidistant to any point on the second torsional axis of rotation.

In some embodiments, the first and the second connected concentric spiral beam springs are circular.

In some embodiments, the at least one bending spring comprises a pair of articulated beam springs each comprising a plurality of partial sections of concentric circles defining a sector of a circle wherein adjacent sections are alternatingly connected at only one end to an adjacent section.

In some embodiments, the at least one bending spring comprises a pair of S-shaped bending springs.

In some embodiments, the at least one bending spring comprises a pair of articulated beam springs each with a medial point and connected at the medial point.

In some embodiments, the mirror is made of silicon plated with a metal.

In some embodiments, the metal comprises Au, Al or Cu layers.

In some embodiments, a plurality N of devices is arranged side by side to form a 1×N MEMs array, where N≧2.

In some embodiments, a plurality N×M of devices according is arranged in N rows of M devices thereby forming an N×M MEMs array, where N≧2 and M≧2.

In some embodiments, the mirror is used for optical switching.

According to anther broad aspect, the invention provides an optical switch, comprising: a plurality of optical ports; a plurality of devices each adapted to switch light between a respective pair of optical ports.

BRIEF DESCRIPTION OF THE DRAWINGS

Preferred embodiments of the invention will now be described with reference to the attached drawings in which.

DETAILED DESCRIPTION OF THE PREFERRED EMBODIMENTS

Figure 1A:
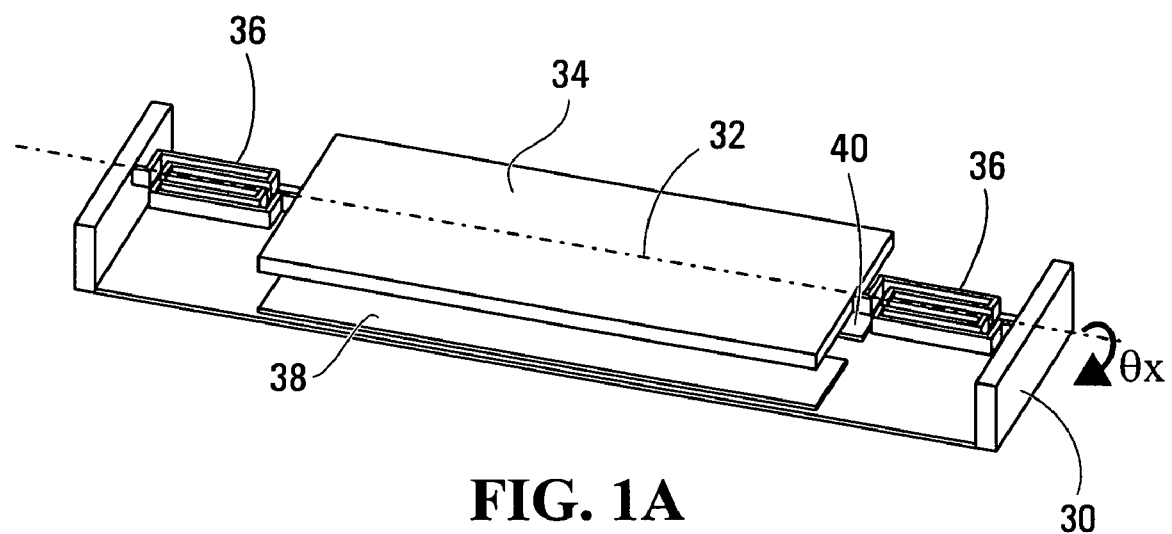
FIG. 1A and FIG. 1B provide two views of a conventional 1 dimensional MEMS mirror with an articulated suspension structure.
Figure 1B:
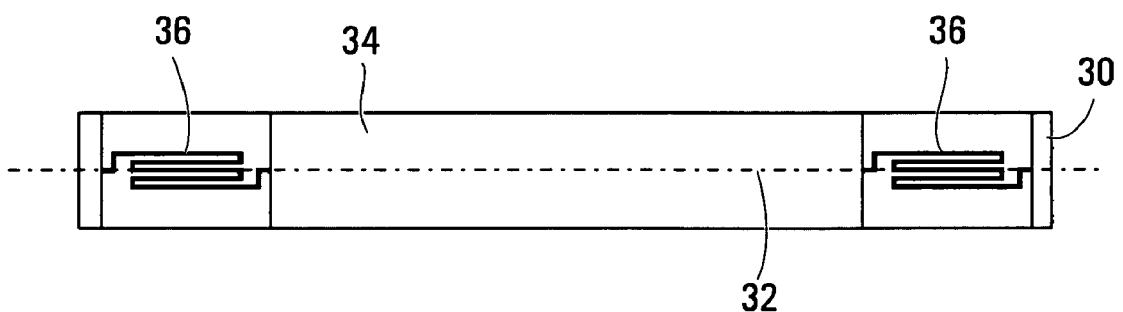
Figure 2A:
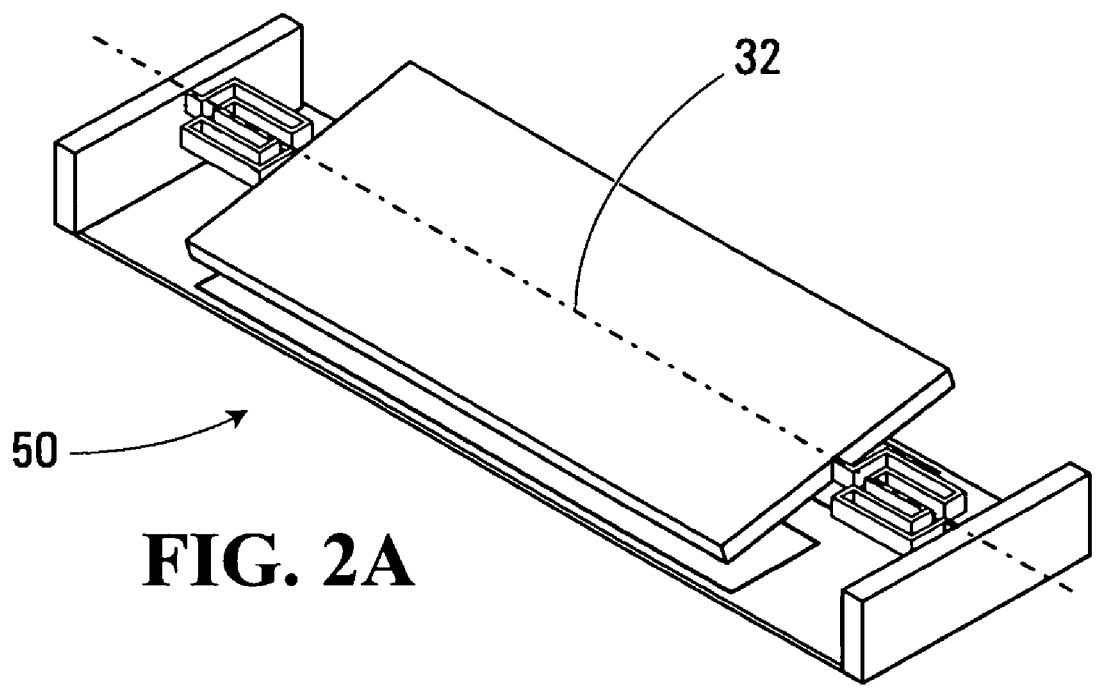
FIG. 2 shows the device of FIG. 1 in two rotational states.
Figure 2B:
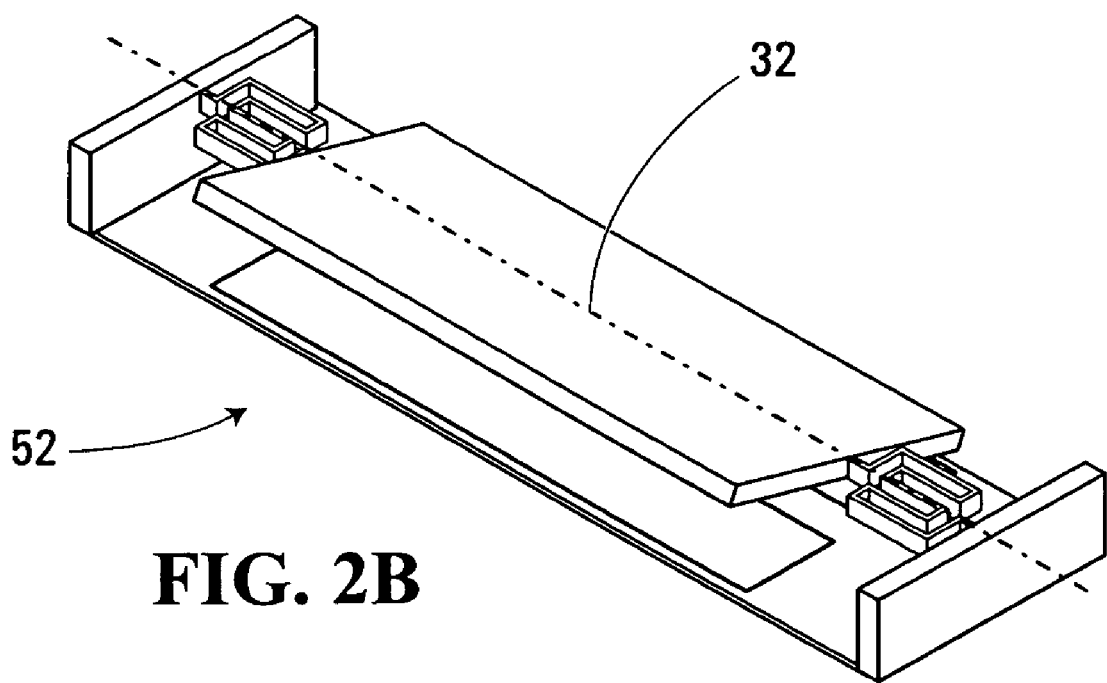

A known 1D MEMS torsional mirror supported by articulated suspension springs/hinges is shown in FIGS. 1A and 1B. This arrangement consists of a support structure 30 within which is mounted a mirror 34 connected to the support structure 30 through two articulated hinges 36. Typically, the entire mirror plus articulated hinges arrangement is made of a single piece of silicon. The articulated hinges 36 consist of a silicon beam with a high aspect ratio of length to width thereby allowing torsional rotation. Using articulation allows a long silicon beam to be provided in a very small space. Also shown is a pair of address electrodes 38 and 40. These would be connected to control systems capable of applying voltages to the electrode. Typically the mirror arrangement would be attached to ground. The mirror 34 can be rotated around its rotational axis (θx) 32 by applying electrostatic force on either side of the mirror using the electrodes 38,40. This is shown in FIG. 2. Generally indicated at 50 is the mirror in a first configuration where the mirror has been rotated counter clockwise about the rotational axis 32 and generally indicated at 52 shows the same arrangement in which the mirror has been rotated clockwise about the rotational axis 32.

Figure 3A:
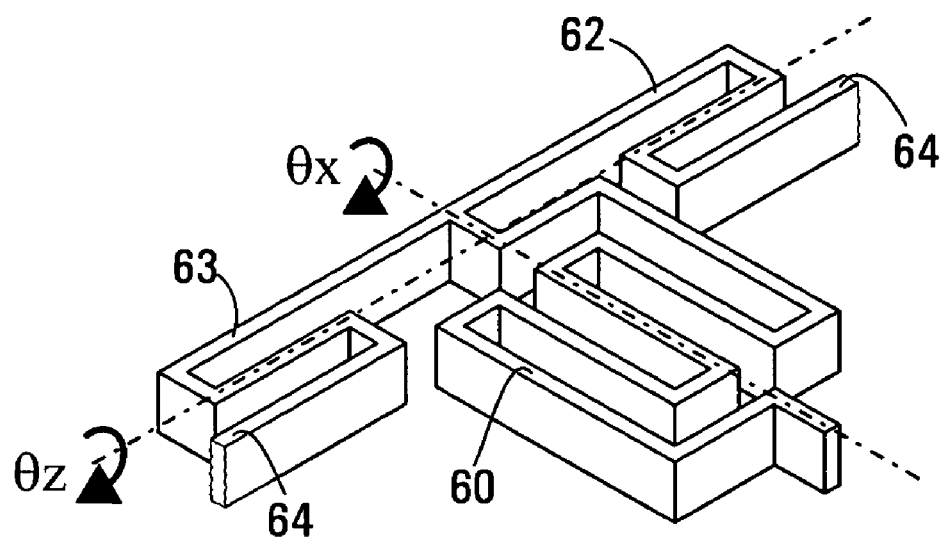
FIG. 3A is a plan view of a two dimensional articulated rotational hinge provided by an embodiment of the invention.

To facilitate 2D rotation of a mirror, that is rotation in both (θx) and (θz), θz being orthogonal to the main torsional tilt (θx), an embodiment of the invention provides a 2D rotatable articulated hinge. A top view of a new articulated hinge is shown in FIG. 3A. The 2D rotatable articulated hinge includes a first articulated hinge portion 60 and a pair of second articulated hinges 62,63. Each of the second articulated hinges 62,63 is connectable to a support structure indicated generally at 64 and is also connected to the first articulated hinge 60. Each of the three articulated hinges 60,62,63 is similar to the conventional articulated hinge 36 of FIG. 1A. Namely each articulated hinge consists of a silicon beam with high aspect ratio thickness to width. The entire arrangement consisting of the three articulated hinges 60,62,63 is preferably made from a single unitary piece of silicon. In other embodiments, the arrangement is made of a deposited material such as Polysilicon, Silicon Nitride, Silicon dioxide, and Metallic depositable materials. Other materials may be employed. Preferably the construction is unitary in the sense that no assembly is required. However, the beams may be made of multiple materials, for example in a layered structure. The first articulated hinge 60 allows rotation along a first torsional axis (θx) while each of the second articulated hinges 62 and 63 allow rotation about a second axis (θz).

Figure 3B:
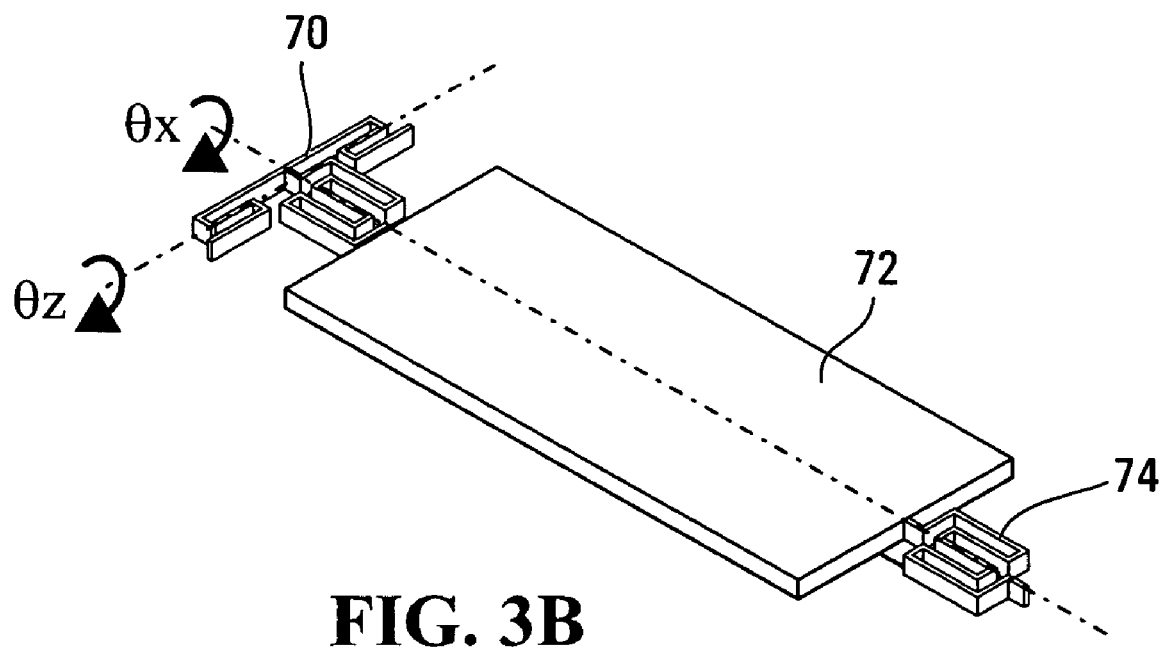
FIG. 3B illustrates a MEMS mirror featuring the two dimensional rotational articulated hinge of FIG. 3A.

Referring now to FIG. 3B, shown is a first example use of the articulated hinge of FIG. 3A. Here the articulated hinge is generally indicated by 70 and is connected to a mirror 72 at the opposite end of which there is another 1D articulated hinge 74. Preferably the entire arrangement of FIG. 3B is made from a single piece of silicon. The arrangement as shown in FIG. 3B allows the mirror 72 to rotate about the main rotational axis (θx) and the additional rotational axis (θz) which is orthogonal to the main rotational axis.

Figure 4A:
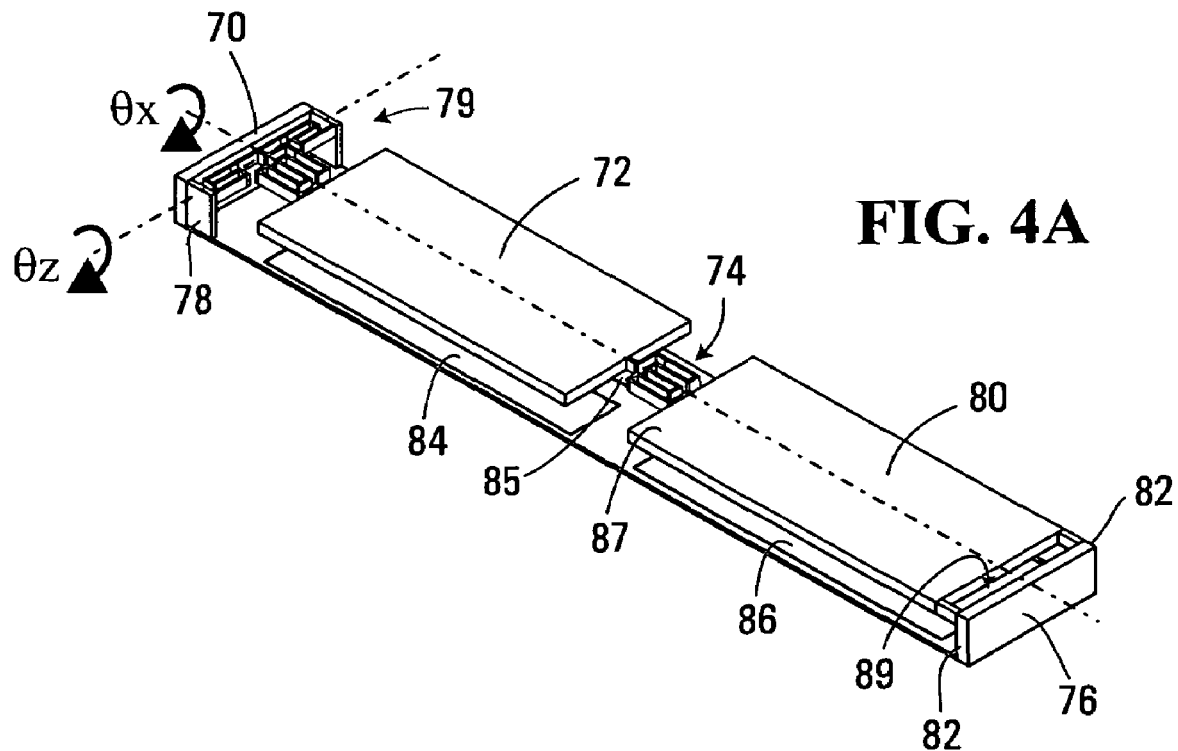
FIG. 4A is a view of a mirror with a two dimensional rotational articulated hinge and moving cantilever mounting system provided by an embodiment of the invention.

In a preferred embodiment of the invention, the arrangement of FIG. 3B is employed in an apparatus illustrated by way of example in FIG. 4A. Here, again the mirror 72 is shown connected to the 2D rotational articulated hinge 70 and 1D rotational articulated hinge 74. A support structure is generally indicated by 76. The 2D rotational articulated hinge 70 is connected in two places 78,79 to the support structure. The 1D rotational articulated hinge 74 is connected to the support structure 76 through a cantilever 80. The cantilever is preferably simply another piece of silicon which is connected to the support structure 76 at 82 in a manner which allows substantially no rotation of this cantilever about the main rotational axis (θx). However, the cantilever 80 does have some flexibility, and in particular, the end 87 of the cantilever 80 most remote from the connection 82 to the support structure is capable of some up and down motion. To allow additional flexibility of the cantilever 80, parts may be removed. In the illustrated example, the cantilever 80 includes a gap 89 near the mounting point 82 to support structure 76. This reduces the amount of force necessary to cause the up and down motion of point 87.

To control rotation in the torsional axis (θx), electrodes are provided 84,85 which operate similar to the electrodes 38,40 of FIG. 1A. This allows the control of the rotation of the mirror 72 about the main torsional axis. Also shown is an electrode 86 beneath the cantilever structure 80 which controls the up and down motion of the end 87 of the cantilever 80 most remote from the connection 82 to the support structure 76. The up and down motion of this point 87 causes rotation of the mirror 72 about the additional rotational axis (θz), thus making the mirror tilt in both axes either simultaneously or independently.

Any suitable dimensions for the articulated hinges may be employed. Different numbers of articulations can be employed. The more articulations included in a given articulated hinge, the less will be the required force to cause rotation about the respective axis. In an example implementation, the dimensions of the various hinges are as follows:

| | |
|---|---|
| Hinge 62 and 63: | {75 um (L), 1.5 um (W), 15 um (T), 5 um (Gap) and 3 (articulations)}; |
| Hinge 60 and 74: | {75 um (L), 1.5 um (W), 15 um (T), 5 um (Gap) and 11 (articulations)} |

In preferred embodiments, both for the embodiment of FIG. 4A and subsequently described embodiments, some or all of the entire structure used to make the mirror, cantilevers and articulated hinges is connected to ground, and behaves like an electrode. For example if these components are made of doped silicon they become conductive. In this way, by applying a voltage to an electrode (for example electrode 84 of FIG. 4A) the mirror behaves as the second electrode without the need to deposit a second designated electrode.

Figure 4B:
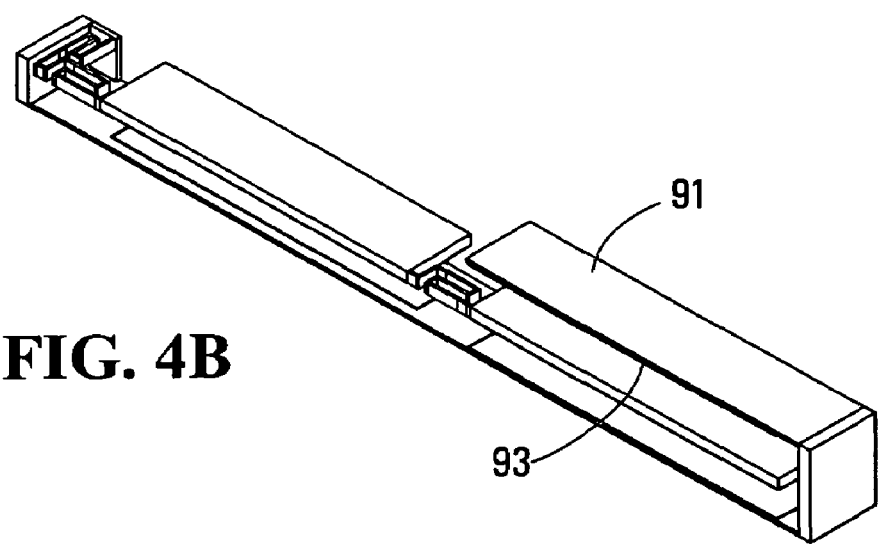
FIGS. 4B and 4C provide a cutaway and side sectional view of a mirror with a two dimensional rotational articulated hinge and moving cantilever mounting system provided by another embodiment of the invention.

In some embodiments, in order to provide the most flexible control over the rotation over the additional rotational axis (θz), an additional support structure is provided on top of the cantilever 80 with an additional electrode so that a force could be applied to cause the end of 87 of the cantilever 80 to move upwards. However, in some applications, this additional degree of freedom may not be required. An example of this is shown in FIG. 4B (and the side view in FIG. 4C) which is very similar to FIG. 4A, with the exception of the additional support structure 91 and additional electrode 93 which allow an electrostatic force to be applied to the cantilever structure to move it both up and down. Note the view of FIG. 4B only shows half of the structure.

The embodiment of FIG. 4A has employed the use of electrodes through which electrostatic forces can be applied to control rotation in the two rotational axes. More generally, any other type of force could also be employed in either or both of these rotational axes. For example thermal, magnetic, thermal bimorph or piezo-electric forces can be employed to achieve the required rotation and control.

This combination of the 2D rotational articulated hinge, an articulated torsional mirror, and a moving cantilever results in a fully functional 2-D MEMS mirror. The cantilever can be deflected in either up or down directions depending on the arrangement of electrodes or force application, thus making the torsional mirror rotate about the second axis θz in either direction. For most electrostatic applications, the cantilever can be deflected downwards only to reduce the number of I/O's and control complexity.

Figure 5:
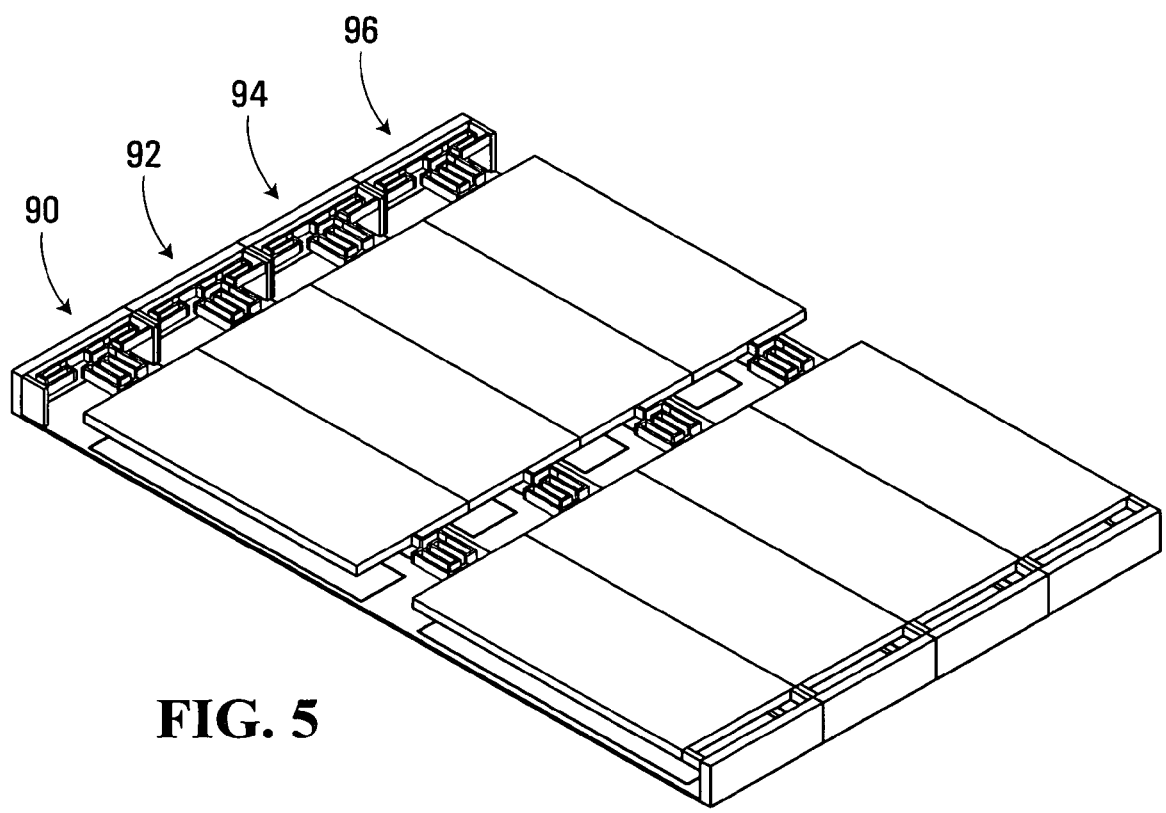
FIG. 5 is a one dimensional MEMS array of devices like the device of FIG. 4A.
Figure 6:
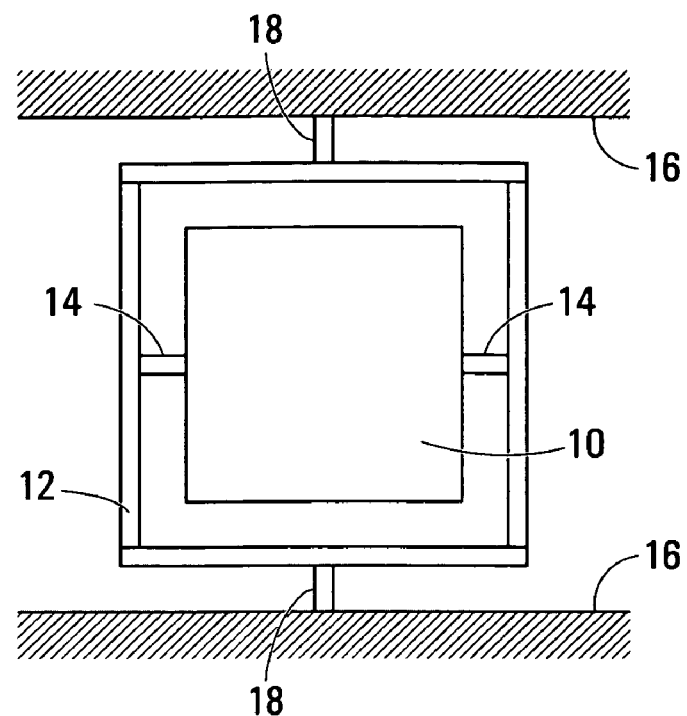
FIG. 6 is a view of a conventional two dimensional gimbal mirror with a supporting frame.
Figure 7:
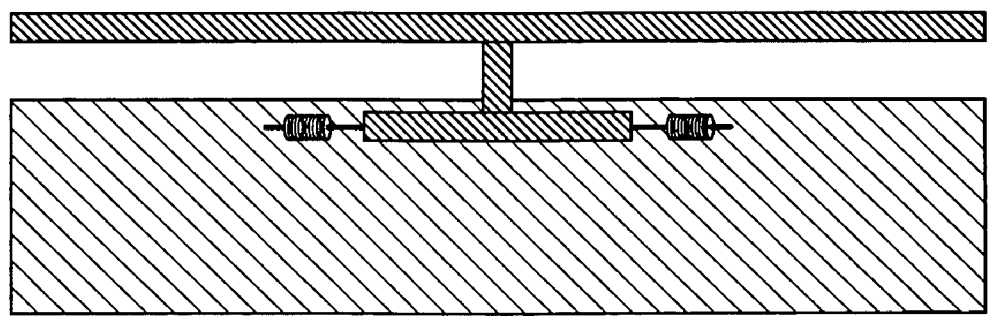
FIG. 7 is a representative sketch of a MEMS mirror with a hidden hinge structure.
Figure 8:
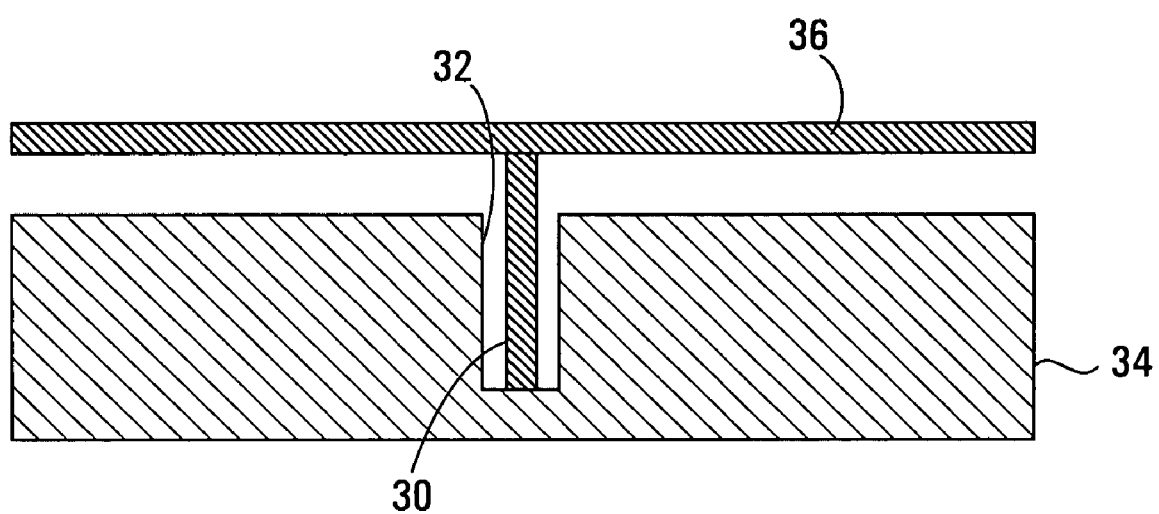
FIG. 8 is a representative sketch of a 2D mirror mounted on a single moving flexible post.

A number of mirrors can be placed side by side to make a linear mirror array with minimal spacing between two mirrors. An example of this is shown in FIG. 5 where a linear array of four 2D torsional mirrors 90,92,94,96 with 2D rotational articulated hinges and cantilevers is shown. An arbitrary number could be included in such an array. Another embodiment provides a two dimensional array of N×M such mirror devices.

One of the main advantages of the structure of FIG. 4A is the minimal coupling between the two tilt axes. This device structure can be used in any number of applications. It can be used as a single mirror for any appropriate application of a single or multi-array configuration. The arrangement achieves a high fill factor for mirror arrays (that is the spacing between two consecutive mirrors in an array is minimized) and is very simple to fabricate. The spacing between two mirrors can be as low as few microns or as limited by microfabrication processes.

Figure 4D:
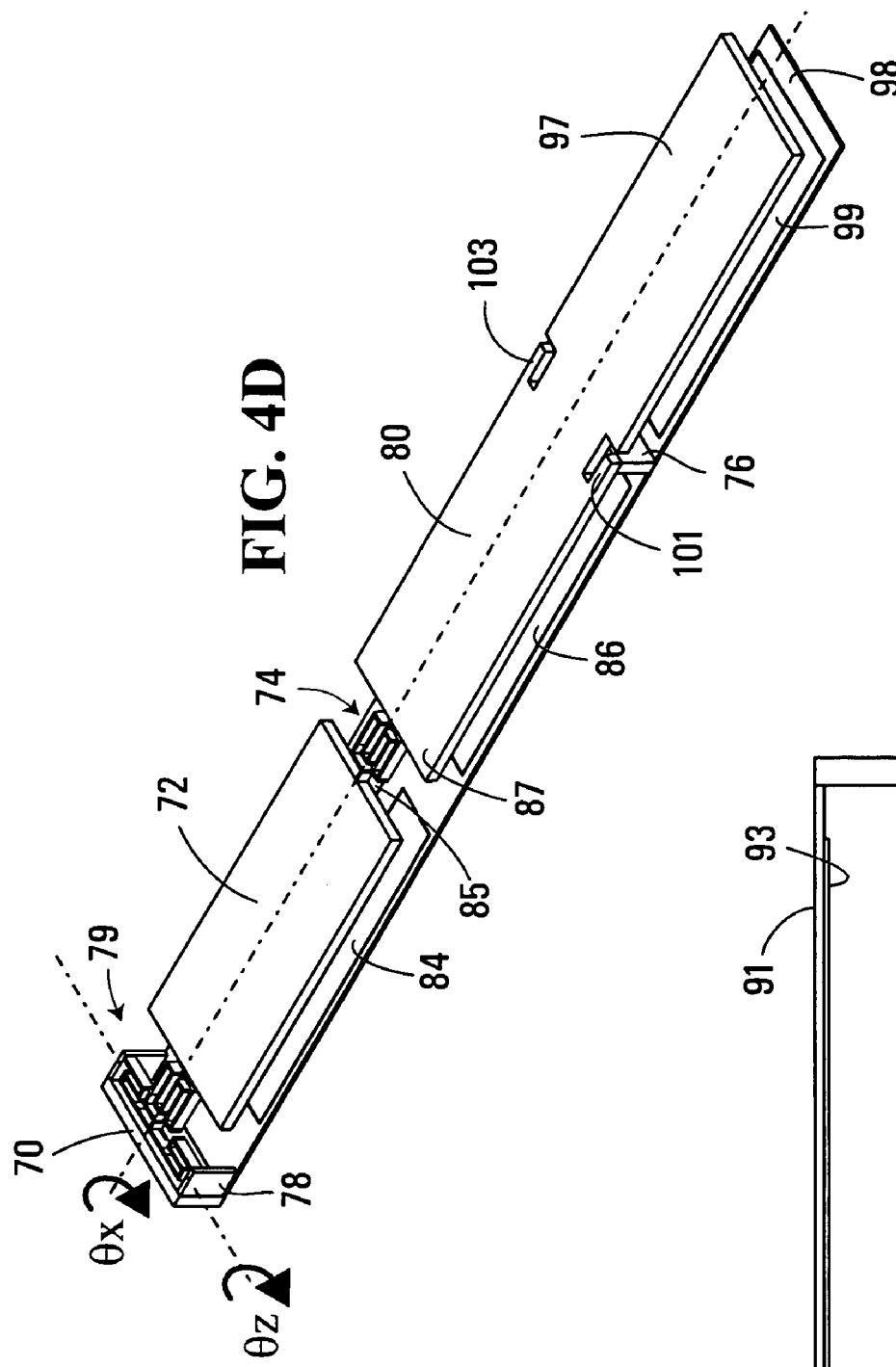
FIG. 4D is a view of a mirror with a two dimensional rotational articulated hinge and moving cantilever mounting system provided by another embodiment of the invention.
Figure 4C:
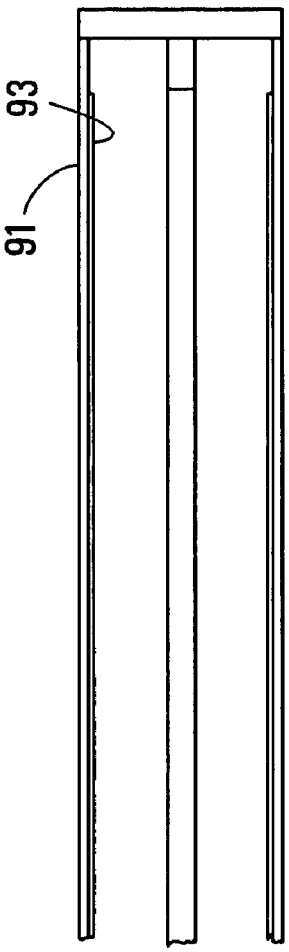

Another embodiment of the invention will now be described with reference to FIG. 4D. This embodiment is very similar to that of FIG. 4A. This embodiment includes a rigid extension 97 of the cantilever 80 mounted over further support structure 98 to which an additional electrode 99 is affixed. The cantilever 80 and the rigid extension 97 of the cantilever 80 together pivot about mounting points 101,103 to the support structure 76. In operation, with this arrangement an electrostatic force can be applied between the electrode 87 and cantilever 80 to move point 87 in a downward direction. Similarly, an electrostatic force can be applied between electrode 99 and the rigid extension 97 to cause the end 87 of cantilever 80 to move upwards. Thus, the arrangement of FIG. 4D provides the same flexibility as the arrangement of FIG. 4B provided earlier in that both upwards and downwards mobility in the second axis of rotation (θz) is possible. The attachment of the cantilever structure composed of combined elements 80 and 97 to the support structure can either be pivotable, or rigid. In the event of a rigid connection, the support structure 76 would need to have some flexibility to allow the upwards and downwards motion of the cantilever structure on either side of support structure 76.

Figure 10A:
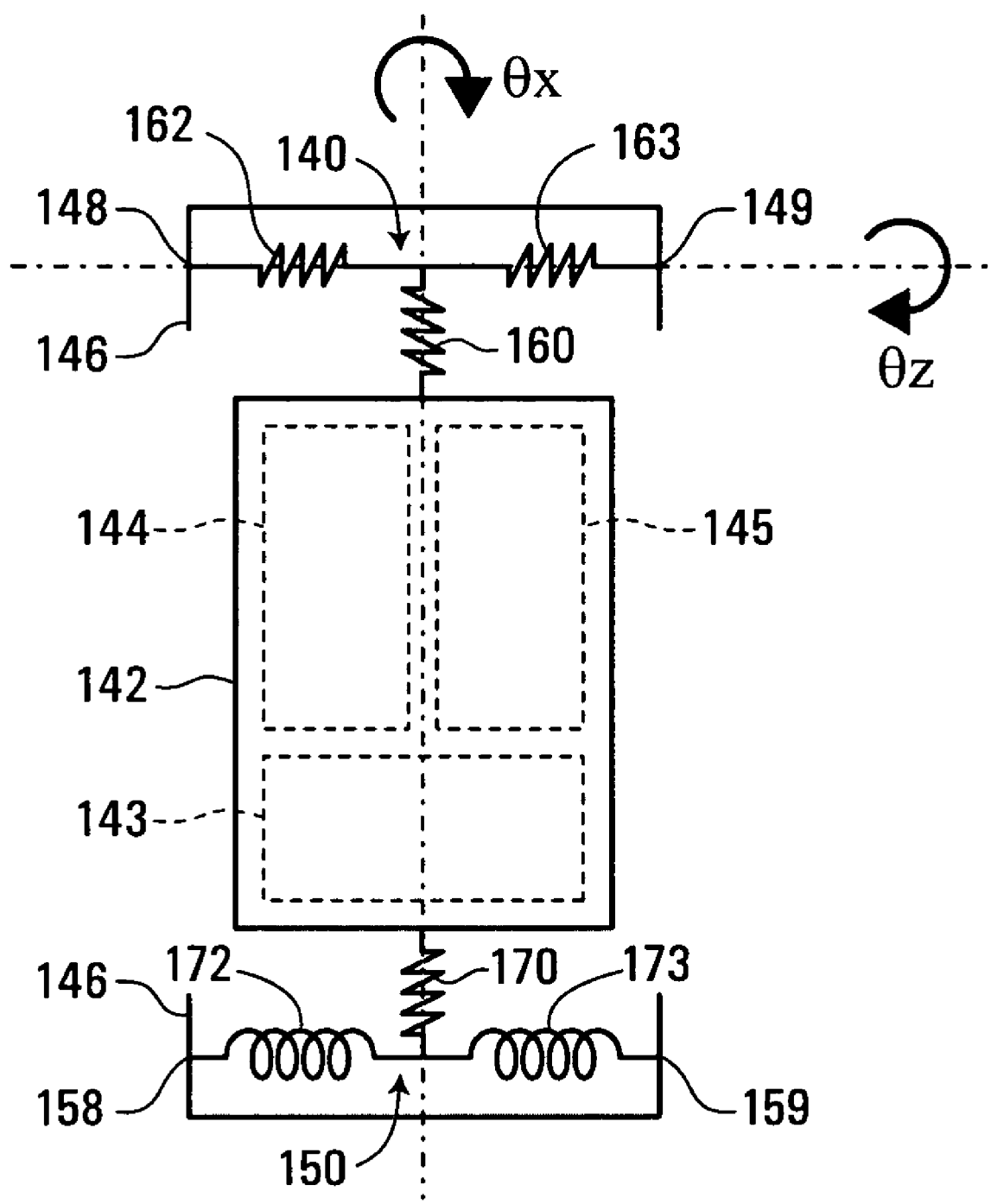
FIG. 10A is a schematic of a mirror with one 2-dimensional rotational T-shaped hinge and a flexible connection provided by another embodiment of the invention.

Another embodiment of the invention will now be described with reference to FIG. 10A. This embodiment provides a 2D MEMS mirror device comprising a mirror 142, a 2D rotational T-shaped hinge 140, a support structure generally indicated by 146 and a flexible connection 150. In this embodiment rotation of the mirror 142 about both a first axis of rotation (θz) and a second axis of rotation (θx) is caused by direct actuation of the mirror 142. FIG. 10A shows an example implementation of this embodiment. The 2D rotational T-shaped hinge 140 comprising a first 1-dimensional torsional spring 162 having a first mounting point 148 at a first end for connection to the support structure 146 and having a second end; a second 1-dimensional torsional spring 163 having a second mounting point 149 at a first end for connection to the support structure 146 and having a second end, the second end of the first 1-dimensional torsional spring 162 being connected to the second end of the second 1-dimensional torsional spring 163; and a third 1-dimensional torsional spring 160 having a first end connected to the second ends of the first and second 1-dimensional torsional springs 162,163 and having a second end for connection to a first end of the mirror 142. The first 1-dimensional torsional spring 162 and the second 1-dimensional torsional spring 163 define the first axis of rotation θz between the first and second mounting points 148,149, and the third 1-dimensional torsional spring 160 defines the second torsional axis of rotation θx perpendicular to the first axis of rotation θz between the first end and second end of the third 1-dimensional torsional spring 160.

In the illustrated example, the flexible connection 150 comprises a T-shaped hinge comprising a first spring 172 having a first mounting point 158 at a first end for connection to the support structure 146 and having a second end; a second spring 173 having a second mounting point 159 at a first end for connection to the support structure 146 and having a second end, the second end of the first spring 172 being connected to the second end of the second spring 173; and a third spring 170 having a first end connected to the second ends of the first and second springs 172,173 and having a second end for connection to a second end of the mirror 142 opposite the first end of the mirror 142. In the illustrated example, the first and second springs 172,173 comprise bending springs and the third spring 170 comprises a torsional spring.

First and second electrodes 144,145 are respectively provided on either side of the primary rotational axis θx beneath the mirror 142 and proximal the first end of the mirror 142 to respectively apply electrostatic force to the mirror to cause rotation of the mirror in each respective direction about the second torsional axis of rotation θx. Also shown is a third electrode 143 beneath the mirror 142 and proximal the second end of the mirror 142 to cause rotation about the first rotational axis θz. In the illustrated example, three electrodes 144,145,146 are shown. More generally any number of electrodes greater than one may be provided.

In some embodiments, an electrode is provided below and proximal each corner of the mirror. For example, for a mirror with four corners, four electrodes are provided below the mirror.

In some embodiments, the torsional springs 160,162,163 of the 2D rotational T-shaped hinge 140 are articulated like the 1D rotational articulated hinges 60,62,63 of the 2D rotational articulated T-shaped hinge shown in FIG. 3A.

In operation, rotation about the second rotation axis θx is achieved by operating the first and second electrodes 144,145 similar to the electrodes 38,40 of FIG. 1A. Rotation about the first rotation axis θz is achieved by applying a voltage to the third electrode 143 in order to apply an electrostatic force to the mirror 142. In the illustrated example, the torsional spring 170 and the two bending springs 172,173 allow the T-shaped hinge of the flexible connection 150 to both bend and rotate, making the T-shaped hinge of the flexible connection 150 more compliant than the 2D rotational T-shaped hinge 140 connected to the first end of the mirror. Therefore, when an electrostatic force is applied to the mirror 142 by the third electrode 143, the T-shaped hinge of the flexible connection 150 will allow a vertical deflection of the second end of the mirror 142, while a vertical deflection of the first end of the mirror is restrained by the 2D rotational T-shaped hinge 140, thereby rotating the mirror 142 about the first axis of rotation θz. Thus, in this embodiment the mirror 142 can be rotated independently about both rotational axes, θx and θz.

FIGS. 10B-10L show alternate implementations of the flexible connection 150 described above, each of which comprise a torsional spring 184 and at least one bending spring 182 for the embodiment comprising a mirror 142, a 2D rotational T-shaped hinge 140 and the flexible connection 150.

The same reference characters have been used throughout FIGS. 10A-10L in order to identify elements with a similar function although they may have a different structure.

In the implementations shown in FIGS. 10B-10L, the torsional spring 184 facilitates rotation of the mirror 142 about the second axis of rotation θx and the at least one bending spring 182 facilitates rotation of the mirror 142 about the first axis of rotation θz by allowing vertical deflection of the second end of the mirror 142. The implementations shown in FIGS. 10B-10L only show the details of the connection of the flexible connection 150 to the second end of the mirror 142. Although it is not shown in FIGS. 10B-10L, the first end of the mirror 142 opposite the second end of the mirror 142 is connected to the support structure 176 through the 2D rotational T-shaped hinge 140 as shown in FIG. 10A.

Figure 10B:
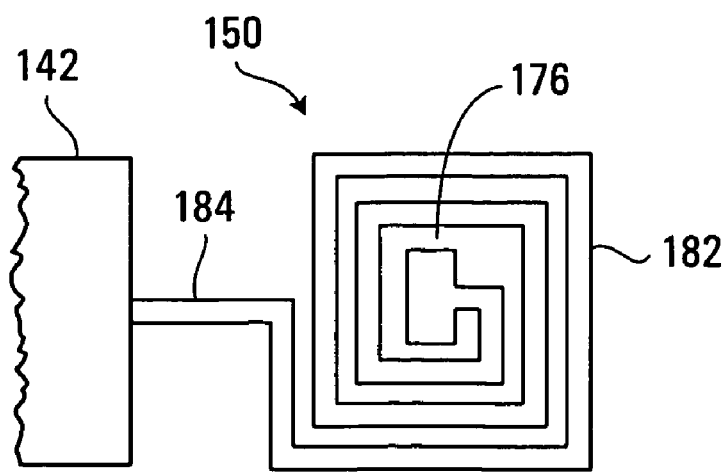
FIGS. 10B-10L are views of alternative implementations of the flexible connection shown in FIG. 10A provided by other embodiments of the invention.

In the example implementation shown in FIGS. 10B, the torsional spring 184 comprises an unarticulated beam with a first end and a second end. The first end of the unarticulated beam is connected to the second end of the mirror 142. The at least one bending spring 182 is a rectangular spiral spring with a first end that is connected to the support structure 176 in the middle of the rectangular spiral and a second end that is connected to the second end of the unarticulated beam.

Figure 10C:
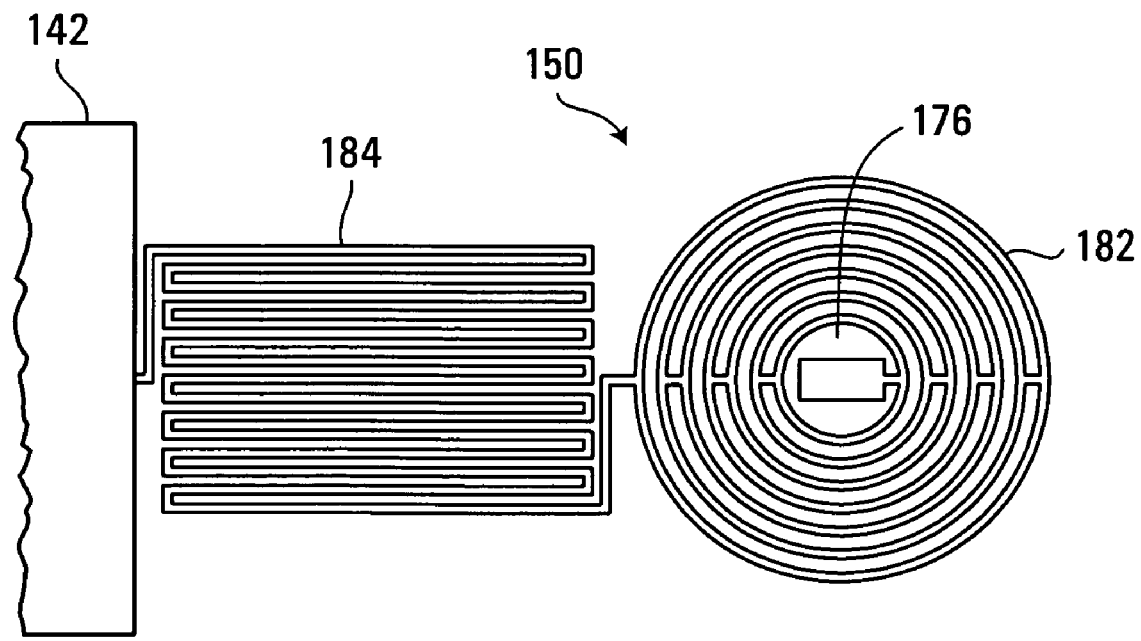

In the example implementation shown in FIG. 10C, the torsional spring 184 is an articulated beam with a first end and a second end that is similar to the 1-D articulated hinge 74 shown in FIG. 3B. The first end of the articulated beam is connected to the second end of the mirror 142. The at least one bending spring 182 is a connected concentric spiral beam spring wherein adjacent concentric beams are connected together at only one point.

In the illustrated example, the connected concentric spiral beam spring is circular. More generally, the connected concentric spiral beam spring may be of any shape, such as elliptical, ovoid or triangular shapes. For example, the example implementations shown in FIGS. 10H and 10J comprise connected concentric rectangular spiral beam springs.

The connected concentric circular spiral beam spring of FIGS. 10C has a first end that is connected to the support structure 176 in the middle of the connected concentric circular spiral beam spring and a second end that is connected to the second end of the articulated beam. The center of the connected concentric circular spiral beam spring is located on the second axis of rotation θx.

In some implementations, the connections between adjacent concentric beams alternate such that the largest concentric beam is connected to the second largest concentric beam at a point opposite its connection to the torsional spring and the second largest concentric beam is connected to the third largest concentric beam at a point that lies opposite the second largest concentric beam's connection to the largest concentric beam, and so on, until the smallest concentric beam connects to the support structure 176.

Figure 10D:
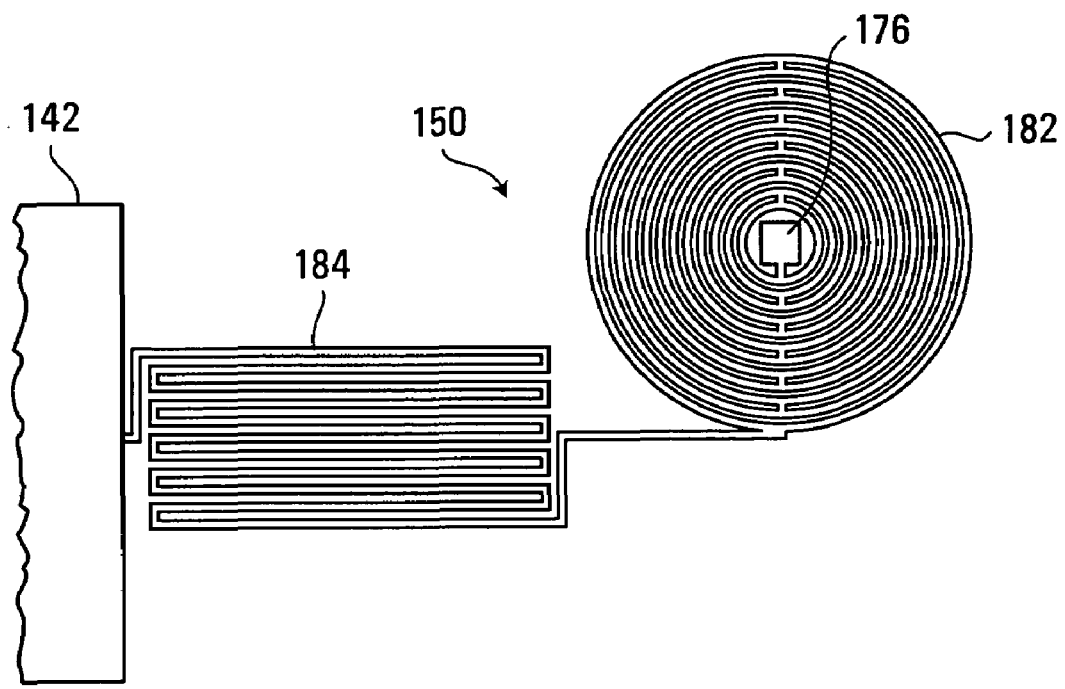

The example implementation shown in FIGS. 10D is very similar to the implementation shown in FIGS. 10C. In the implementation shown in FIGS. 10D, the torsional spring 184 is an articulated beam with a first end and a second end that is similar to the 1-D articulated hinge 74 shown in FIG. 3B. The first end of the articulated beam is connected to the second end of the mirror 142. The at least one bending spring 182 is a connected concentric circular spiral beam spring with a first end that is connected to the support structure 176 in the center of the connected concentric circular spiral beam spring and a second end that is connected to the second end of the articulated beam. The connection between the second end of the connected concentric circular spiral beam spring and the second end of the articulated beam is shown as a rigid beam in FIG. 10D. More generally, the connection between the second end of the connected concentric circular spiral beam spring and the second end of the articulated beam may be either a rigid structure or may be an unarticulated beam extension of the torsional spring 184. The center of the connected concentric circular spiral beam spring is offset from the second axis of rotation θx. The connected concentric circular spiral beam spring has concentric circular beams, wherein adjacent concentric circular beams are connected together at only one point.

Figure 10E:
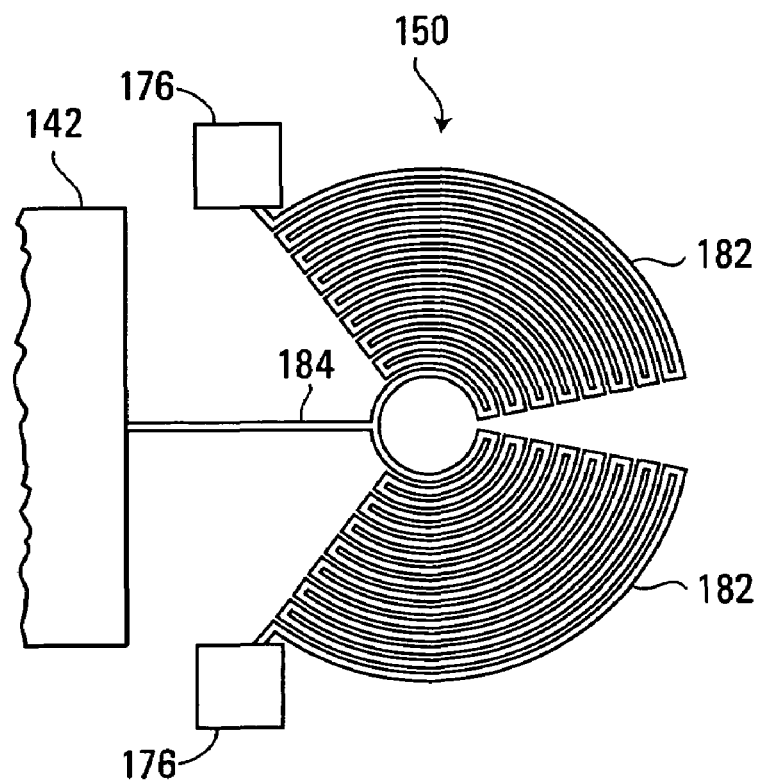
Figure 10F:
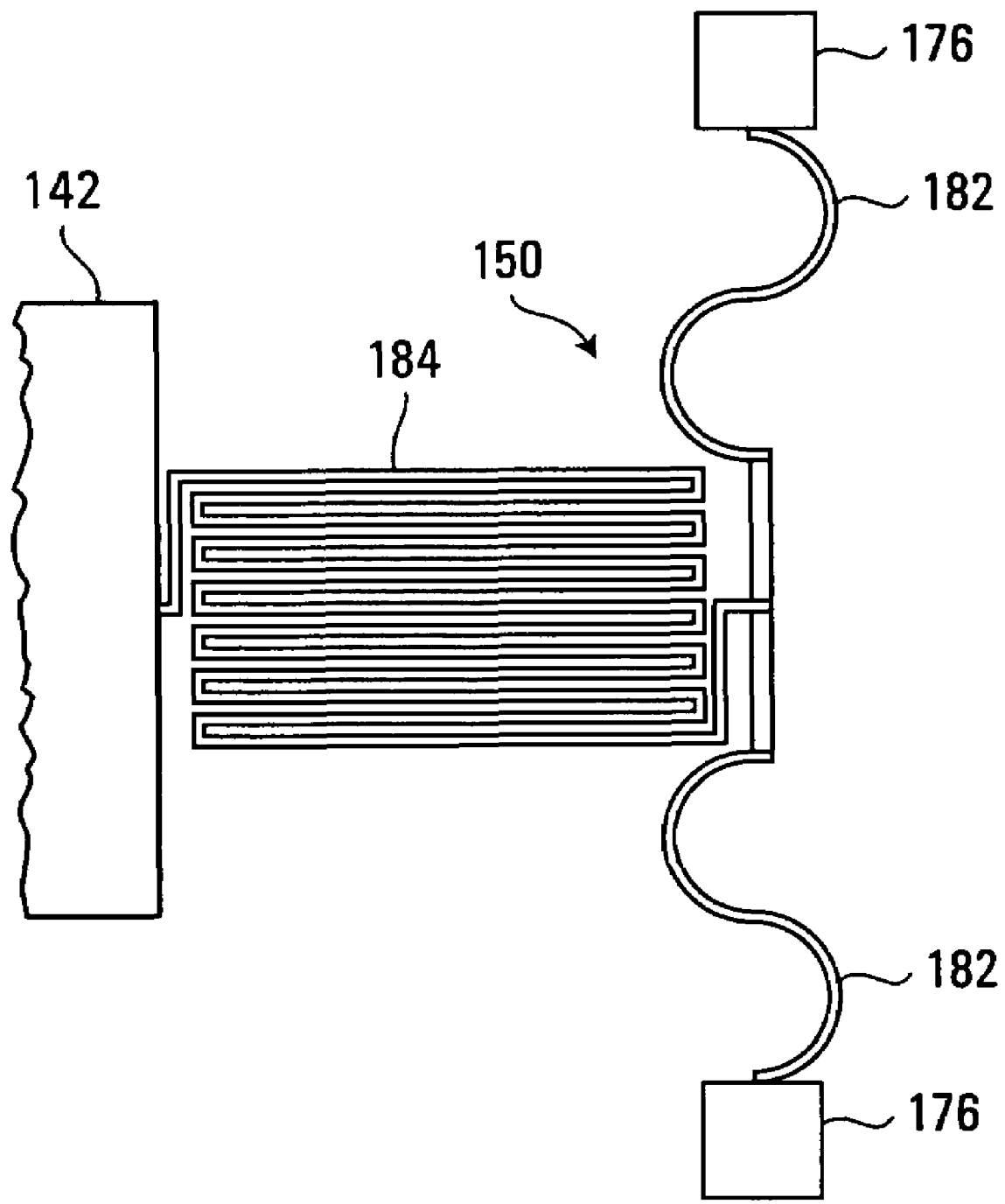
Figure 10G:
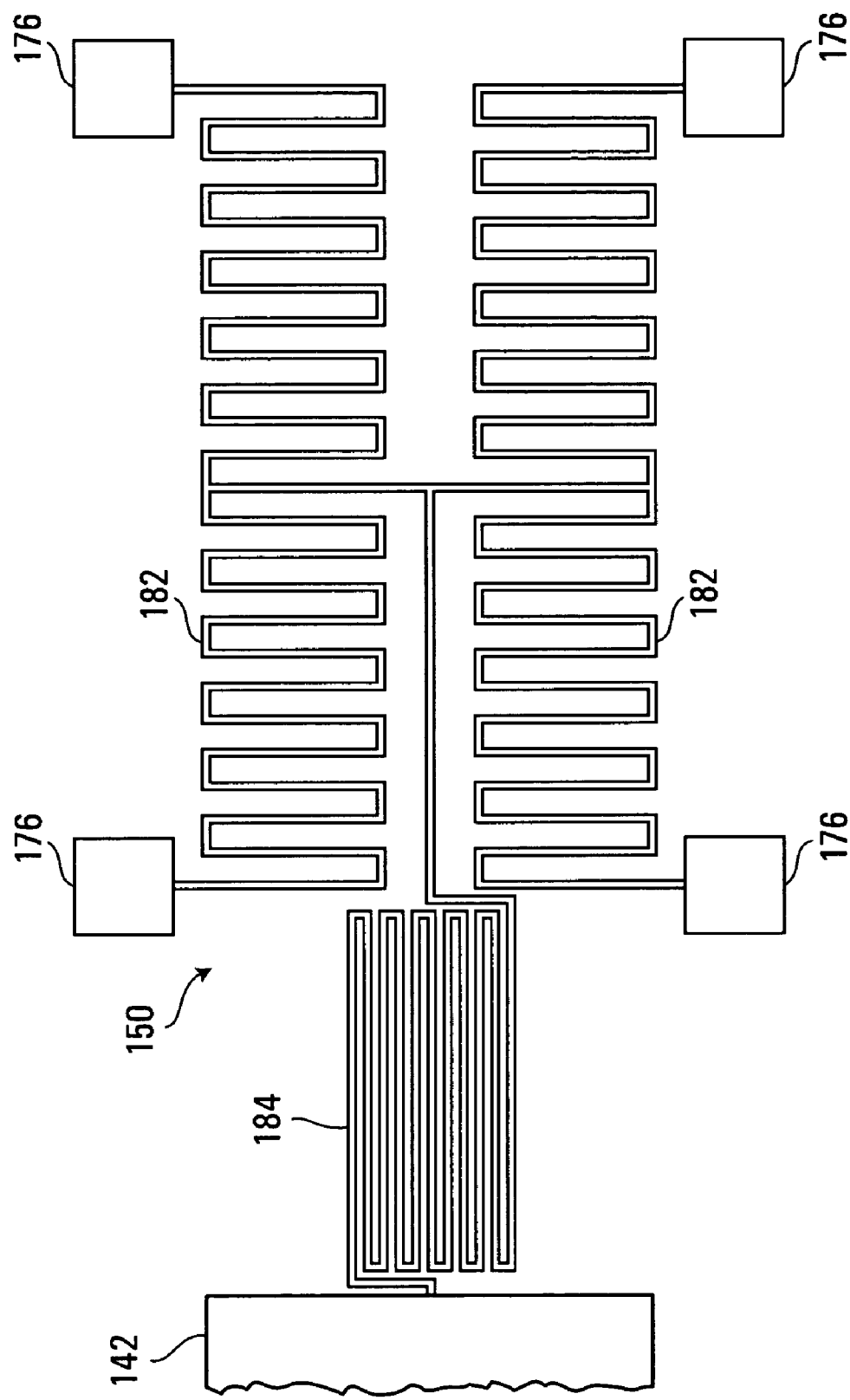
Figure 10H:
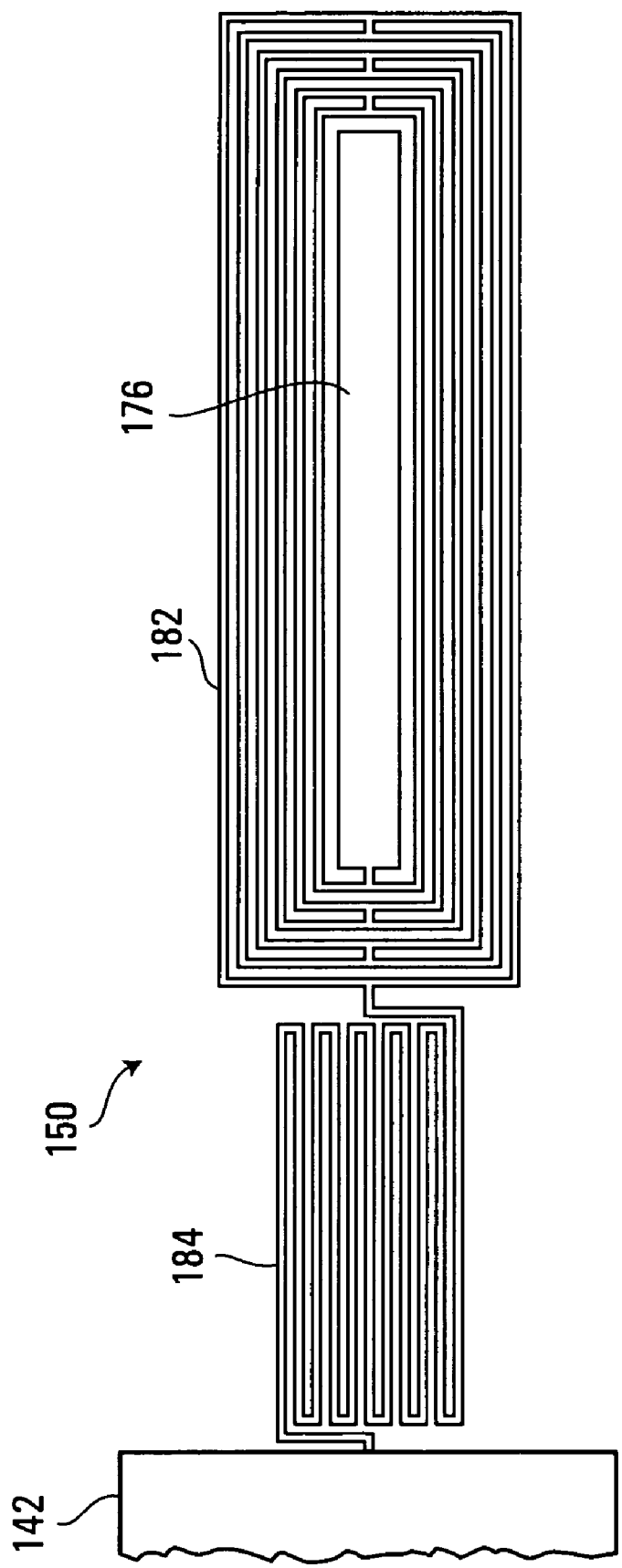
Figure 10I:
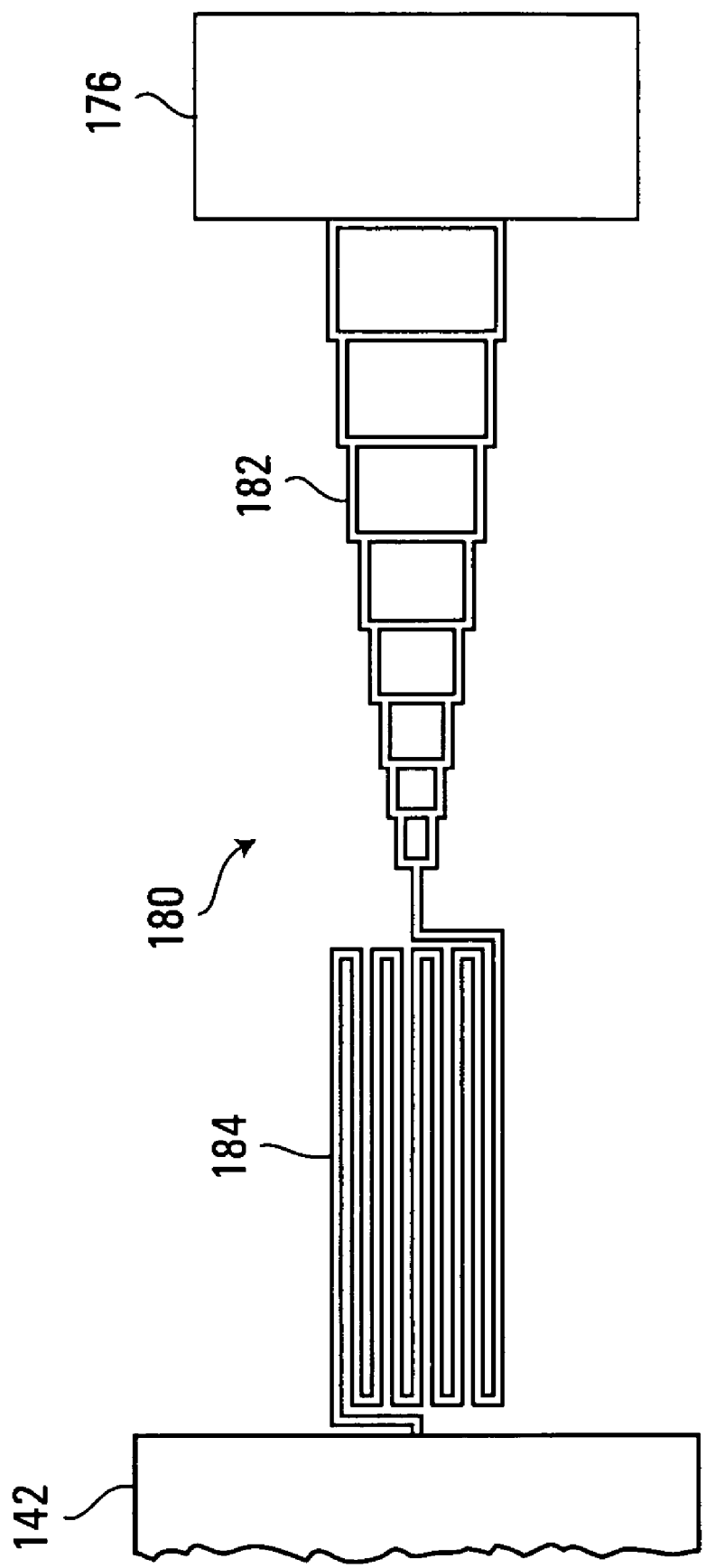
Figure 10J:
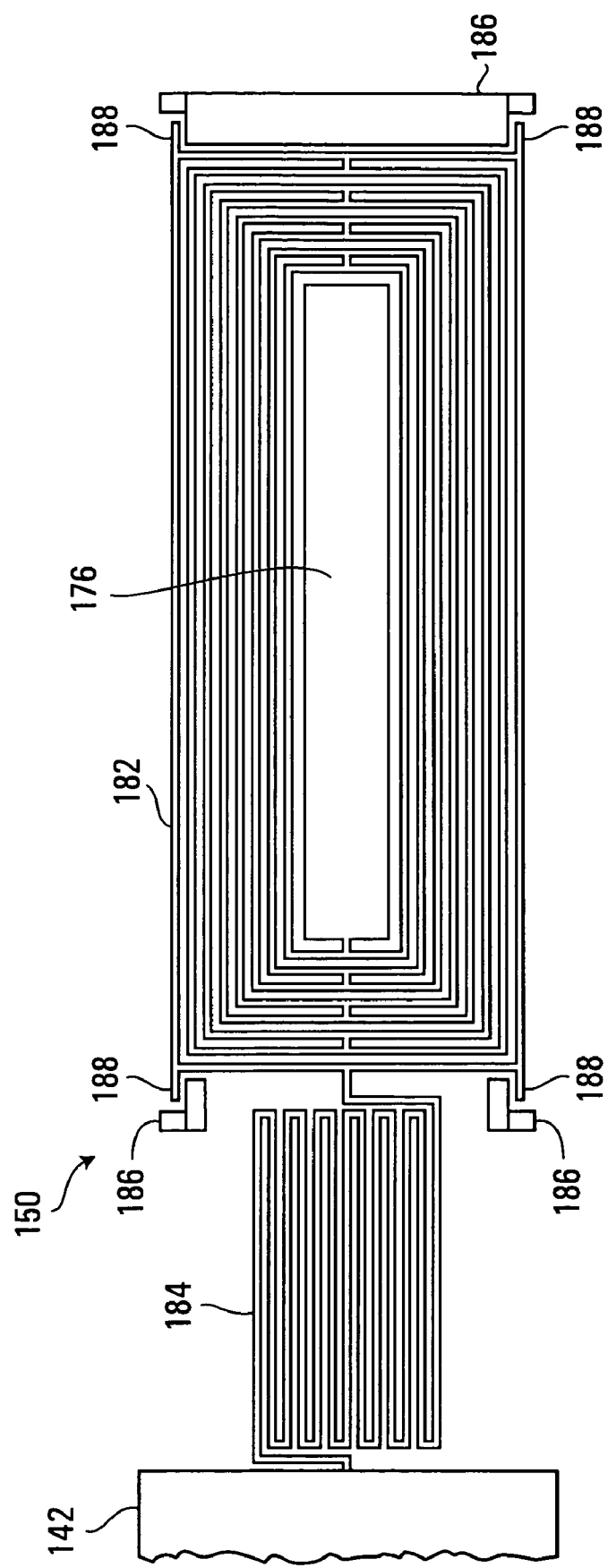
Figure 10K:
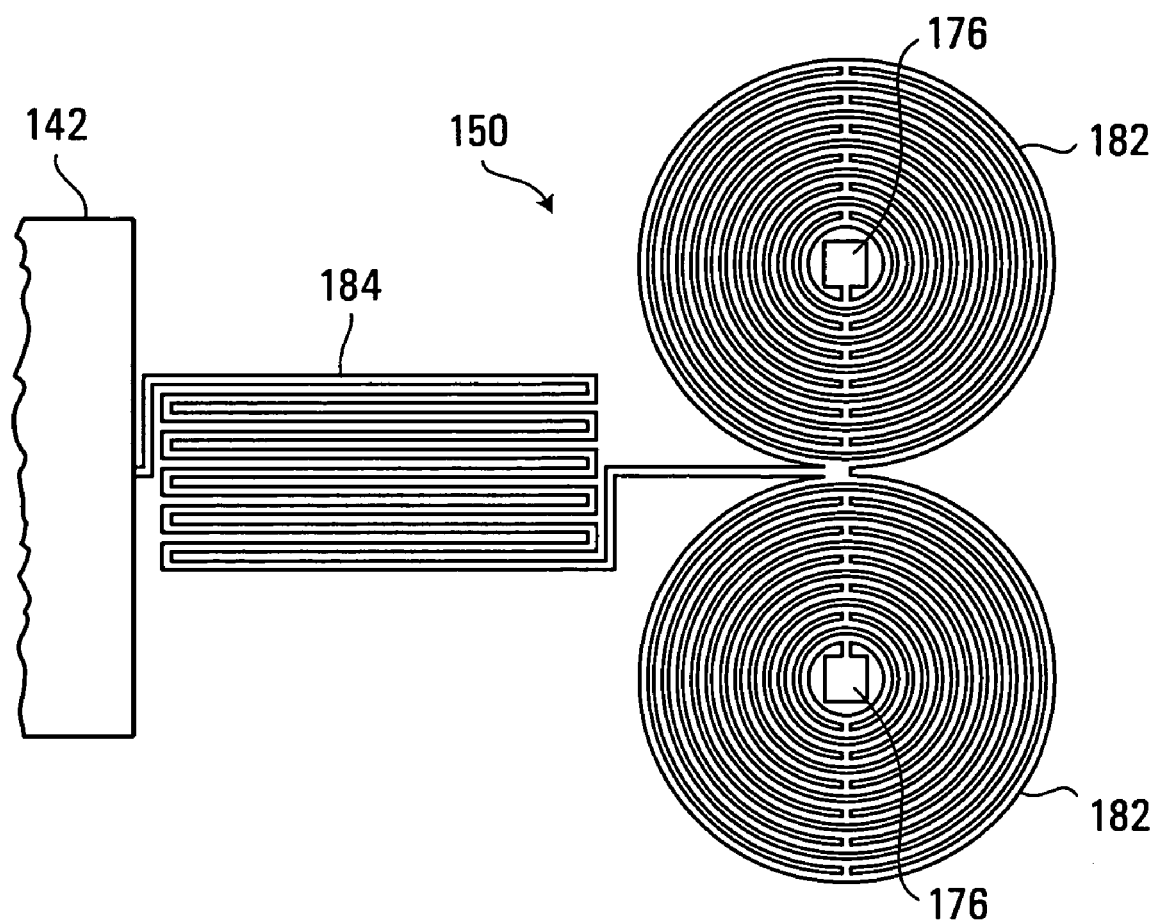

The example implementation shown in FIG. 10K is very similar to the implementation shown in FIG. 10D. In the implementation shown in FIG. 10K, the torsional spring 184 of the flexible connection 150 is an articulated beam similar to the torsional spring 184 shown in FIG. 10D with a first end connected to the second end of the mirror 142 and a second end. The at least one bending spring 182 of the flexible connection 150 is two connected concentric circular spiral beam springs each with a first end that is connected to the support structure 176 in the center of the respective connected concentric circular spiral beam spring and a second end that is connected to the second end of the articulated beam of the torsional spring 184. In the illustrated example, the connection between the second ends of the connected concentric circular spiral beam springs and the second end of the articulated beam of the torsional spring 184 is shown as a rigid beam. More generally, the connection between the second ends of the connected concentric circular spiral beam springs and the second end of the articulated beam of the torsional spring 184 may be either a rigid structure or may be an unarticulated beam extension of the torsional spring 184. The respective centers of the connected concentric circular spiral beam springs are offset on opposite sides of the second axis of rotation θx and are equidistant to any point on the second axis of rotation θx. The connected concentric circular spiral beam spring has concentric circular beams, wherein adjacent concentric circular beams are connected together at only one point.

In FIG. 10K, the two connected concentric spiral beam springs are circular. More generally, the two connected concentric spiral beam springs may be any shape, for example, rectangular, elliptical or triangular.

In the implementation shown in FIG. 10E, the torsional spring 184 is an unarticulated beam with a first end and a second end. The first end of the unarticulated beam of the torsional spring 184 is connected to the second end of the mirror 142. The at least one bending spring 182 is a pair of articulated beam springs each having a first end and a second end. The first ends of the pair of articulated beam springs of the at least one bending spring 182 are connected to the second end of the unarticulated beam of the torsional spring 184. The second ends of the pair of articulated beam springs of the at least one bending spring 182 are connected to the support structure 176 at separate points. Each articulated beam spring of the at least one bending spring 182 has a plurality of partial sections of concentric circles defining a sector of a circle wherein adjacent sections are alternatingly connected at only one end. The center of the concentric circles lies along the second axis of rotation θx.

In the implementation shown in FIG. 10F, the torsional spring 184 is an articulated beam with a first end and a second end that is similar to the 1-D articulated hinge 74 shown in FIG. 3B. The first end of the articulated beam of the torsional spring 184 is connected to the second end of the mirror 142. The at least one bending spring 182 is a pair of S-shaped bending springs, each with a first end and a second end. The first ends of the S-shaped bending springs of the at least one bending spring 182 are connected to the second end of the articulated beam of the torsional spring 184. The connection between the first ends of the S-shaped bending springs of the at least one bending spring 182 and the second end of the articulated beam of the torsional spring 184 is shown in FIG. 10F as a rigid connection beam with a first end, a second end and a medial point, which is shown in the middle for the example illustration. The first ends of the S-shaped bending springs of the at least one bending spring 182 are connected to the first and second ends of the rigid connection beam, and the second end of the articulated beam of the torsional spring 184 is connected to the medial point of the rigid connection beam. The second ends of the S-shaped bending springs of the at least one bending spring 182 are connected to the support structure 176 at separate points.

In the implementation shown in FIG. 10G, the torsional spring 184 is an articulated beam with a first end and a second end that is similar to the 1-D articulated hinge 74 shown in FIG. 3B. The first end of the articulated beam of the torsional spring 184 is connected to the second end of the mirror 142. The at least one bending spring 182 is a pair of articulated beam springs, each with a first end, a second end and a medial point, which is shown in the middle for the example illustration. The first ends and the second ends of the pair of articulated beam springs of the at least one bending spring 182 are connected to the support structure 176 at separate points. The medial points of the pair of articulated beam springs of the at least one bending spring 182 are connected to the second end of the articulated beam of the torsional spring 184. The connection between the medial points of the pair of articulated beam springs of the at least on bending spring 182 and the second end of the articulated beam of the torsional spring 184 is shown as three connected connection beams, each with a first and a second end, which are connected to form a T-shaped connection. The first end of the first connection beam is connected to the medial point of one of the pair of articulated beam springs of the at least one bending spring 182. The first end of the second connection beam is connected to the medial point of the other one of the pair of articulated beam springs of the at least one bending spring 182. The second ends of the first and second unarticulated beams are connected to the second end of the third connection beam. The first end of the third connection beam is connected to the second end of the articulated beam of the torsional spring 184. The first and second connection beams are rigid, while in some implementations the third connection beam may be either a rigid beam or an unarticulated extension of the torsional spring 184.

In the implementation shown in FIG. 10H, the torsional spring 184 is an articulated beam with a first end and a second end that is similar to the 1-D articulated hinge 74 shown in FIG. 3B. The first end of the articulated beam is connected to the second end of the mirror 142. The at least one bending spring 182 comprises a connected concentric rectangular spiral beam spring with a first end that is connected to the support structure 176 in the middle of the connected concentric rectangular spiral beam spring and a second end that is connected to the second end of the articulated beam. The center of the connected concentric rectangular spiral beam spring is located on the second axis of rotation θx. The connected concentric rectangular spiral beam spring has concentric rectangular beams, wherein adjacent concentric rectangular beams are connected together at only one point.

In the implementation shown in FIG. 10I, the torsional spring 184 is an articulated beam with a first end and a second end that is similar to the 1-D articulated hinge 74 shown in FIG. 3B. The first end of the articulated beam of the torsional spring 184 is connected to the second end of the mirror 142. The at least one bending spring 182 comprises a series of connected rectangles of diminishing size. The largest rectangle is connected to the support structure 176 and the smallest rectangle is connected to the second end of the articulated beam of the torsional spring 184. The series of connected rectangles of diminishing size is conceptually similar to the structure that would result from unfolding the connected rectangular spiral spring shown in FIG. 10H. The series of connected rectangles is also similar to an opened cantilever, thus the flexible connection implementation 150 that is shown in FIG. 10I shares some similarities with the connection provided by the 1-D rotational hinge 74 and the cantilever structure 80 shown in FIG. 4A.

The example implementation shown in FIG. 10J is to the same as the implementation shown in FIG. 10H, with the addition of extensions 188 to the largest concentric rectangular beam of the connected concentric rectangular spiral beam spring and the addition of restraining supports 186, which are provided proximal the extensions 188 and the connected concentric rectangular spiral beam spring. Extensions 188 are located at each corner of the connected concentric rectangular spiral beam spring and extend parallel to the second axis of rotation θx. Motion of the connected concentric rectangular spiral beam spring, other than vertical deflection, will cause contact between the connected concentric rectangular spiral beam spring and/or the extensions 188 and the restraining supports 186, thereby limiting the movement of the connected concentric rectangular spiral beam spring and thus the mirror 142. In the illustrated example, extensions 188 provide an added point of contact between the at least one bending spring 182 and the restraining supports 186. Alternatively, extensions may not be provided and movement of the mirror may be limited only by contact between the at least one bending spring 182 and the restraining supports.

In some embodiments, the implementations of the flexible connections shown in FIGS. 10A-10I further comprise restraining supports.

Figure 10L:
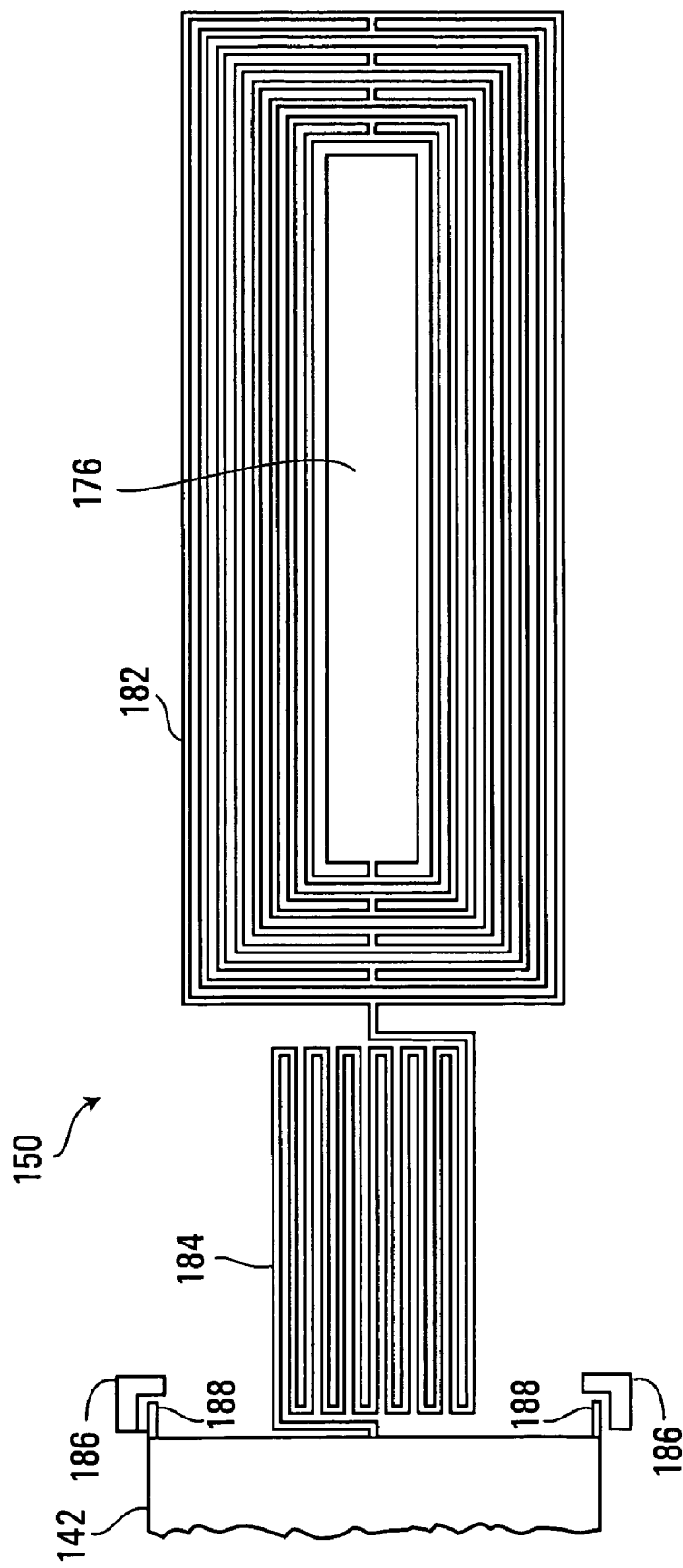

Some embodiments include extensions of the mirror and restraining supports located proximal the extensions in order to limit movement of the mirror. An example of this embodiment is shown in FIG. 10L. The implementation shown in FIG. 10L is similar to the implementation shown in FIG. 10J, except that extensions 188 have been added to the second end of the mirror 142, rather than to the connected concentric rectangular spiral beam spring of the at least one bending spring 182. The restraining supports 186 have also been moved proximal the extension 188 of the second end of the mirror. In the illustrated example, unwanted movement of the mirror, such as side to side movement, is limited by contact between the mirror 142 and/or the extensions 188 and the restraining supports 186.

In some implementations the extensions 188 are not provided and the movement of the mirror is limited by contact between the mirror and the restraining supports.

The embodiments of FIGS. 10A-10L have employed the use of electrodes through which electrostatic forces can be applied to control rotation in the two rotational axes. More generally, any other type of force could also be employed in either or both of these rotational axes. For example thermal, magnetic, thermal bimorph or piezo-electric forces can be employed to achieve the required rotation and control.

This combination of a 2D rotational T-shaped hinge, a mirror and a flexible connection comprising a torsional spring and at least one bending spring results in a fully functional 2D MEMS mirror.

Like the embodiment of FIG. 4A, the embodiments shown in FIGS. 10A-10L can be used in a linear and a 2-dimensional array of N×M such mirror devices.

Another embodiment will now be described with reference to FIG. 11. This embodiment provides a 2D MEMS mirror device comprising a mirror 152, a 2D rotational T-shaped hinge 200, a support structure generally indicated by 199 and a vertical actuator 198 for effecting rotation of the mirror 152 about a first axis of rotation θz. In this embodiment, the 2D rotational T-shaped hinge 200 is similar to the 2D rotational articulated hinge shown in FIG. 3A. The 2D rotational T-shaped hinge 200 comprises a first 1-dimensional torsional spring 192 having a first mounting point 208 for connection to the support structure 199 at a first end and having a second end; a second 1-dimensional torsional spring 193 having a second mounting point 209 for connection to the support structure 199 at a first end and having a second end, the second end of the first 1-dimensional torsional spring 192 being connected to the second end of the second 1-dimensional torsional spring 193; and a third 1-dimensional torsional spring 190 having a first end connected to the second ends of the first and second 1-dimensional torsional springs 192,193 and having a second end for connection to a first end of the mirror 152. The first 1-dimensional torsional spring 192 and the second 1-dimensional torsional spring 193 define the first axis of rotation θz between the first and second mounting points 208,209, and the third 1-dimensional torsional spring 190 defines the second torsional axis of rotation θx perpendicular to the first axis of rotation θz between the first end and second end of the third 1-dimensional torsional spring 190. In this embodiment the vertical actuator 198 is connected to the T-shaped hinge 200 through a rigid connection 196. In the illustrated example, the rigid connection 196 comprises a rigid beam with a first end connected to the vertical actuator 198 and a second end connected to the 2D rotational T-shaped hinge 200 at the point where the second end of the first 1-dimensional torsional spring 192, the second end of the second 1-dimensional torsional spring 193 and the first end of the third 1-D torsional spring 190 are connected. More generally, the rigid connection 196 may be any structure that provides any number of rigid connections between the vertical actuator 198 and the 2-dimensional rotational T-shaped hinge 200 at any number of points, such that movement of the vertical actuator 198 causes rotation of the mirror 152 about the first axis of rotation θz.

In the illustrated example, a second end of the mirror 152 opposite the first end of the mirror 152 is left unconnected and therefore the mirror 152 is supported only by the connections 208,209 to the support structure 199 through the 2D rotational T-shaped hinge 200.

Figure 11:
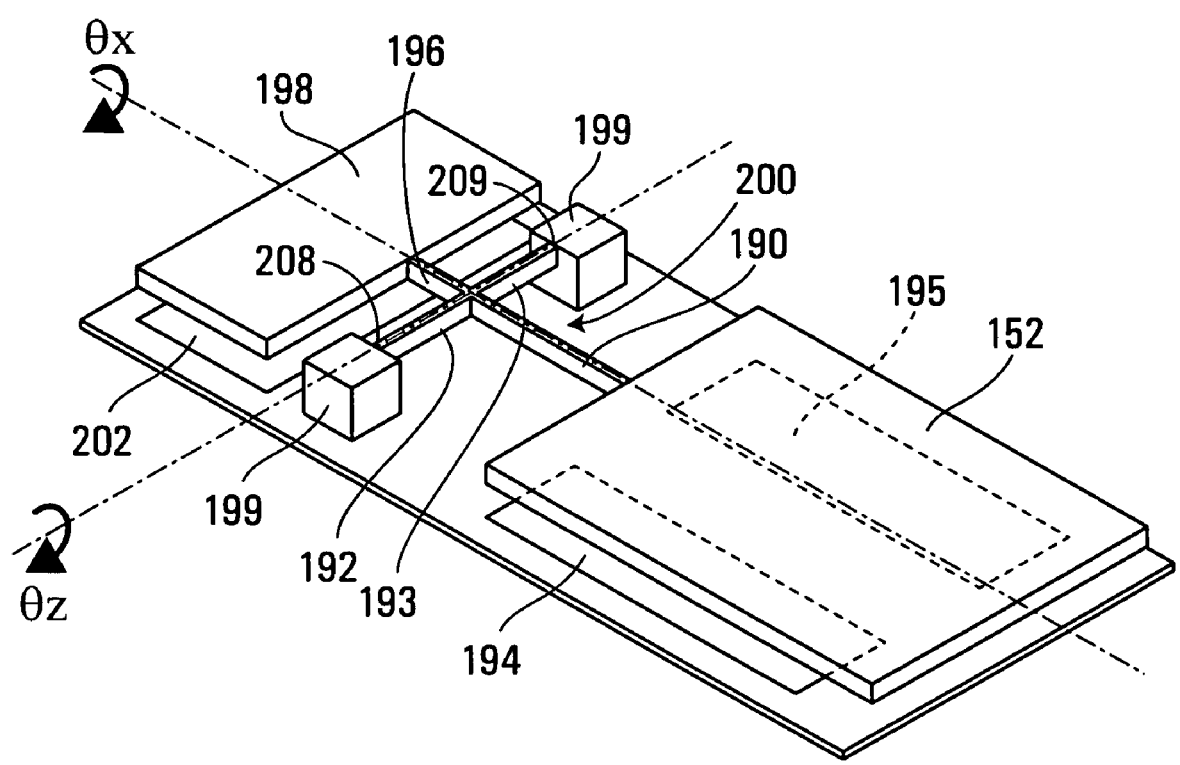
FIG. 11 is a view of a mirror with a 2-dimensional rotational T-shaped hinge and a vertical actuator provided by another embodiment of the invention.

In the illustrated example of FIG. 11, the torsional springs 190,192,193 of the 2D rotational T-shaped hinge 200 are shown as unarticulated beams. More generally, the torsional springs 190,192,193 of the 2D rotational T-shaped hinge 200 may comprise articulated beams with any number of articulations.

In some embodiments, the 2D rotational T-shaped hinge 200 is the 2D articulated rotational T-shaped hinge shown in FIG. 3A.

In some embodiments, each of the torsional springs 190, 192,193 of the 2D rotational T-shaped hinge 200 consists of a silicon beam with high aspect ratio thickness to width. In some embodiments, the 2D rotational T-shaped hinge and the vertical actuator 198 are made from a single unitary piece of silicon. In other embodiments, the arrangement is made of a deposited material such as polysilicon, Silicon Nitride, Silicon dioxide, and Metallic depositable materials. Other materials may be employed. In some embodiments, the construction is unitary in the sense that no assembly is required. However it may be made of multiple materials, for example in a layered structure.

To control rotation in the second axis θx, electrodes 194, 195 are provided which operate similar to the electrodes 38,40 of FIG. 1A. Also shown is an electrode 202 beneath the vertical actuator 198, which controls the up and down motion of the vertical actuator 198. The up and down motion of the vertical actuator 198 causes rotation of the mirror 152 about the first rotational axis θz, thus making it possible to tilt the mirror 152 in both axes.

In the illustrated example, the two electrodes 194,195 are provided below the mirror 152 to cause rotation of the mirror about the second rotational axis θx. More generally, any number of electrodes may be provided. For example, three electrodes might be provided below the mirror 152, similar to the arrangement of the electrodes 143,144,145 shown in FIG. 10A. In this case, the addition of the third electrode provided proximal the second end of the mirror allows vertical deflection of the mirror 152 downwards, as opposed to the upward deflection caused by the vertical actuator 198.

Any suitable dimensions for the torsional springs 190,192, 193 of the T-shaped hinge 200 may be employed. As mentioned above, in some embodiments the 2D rotational T-shaped hinge 200 consists of 1D articulated hinges. The more articulations included in a given articulated hinge, the less will be the required force to cause rotation about the respective axis. In an example implementation, the dimensions of the various beams are as follows:

torsional springs 192 and 193: {30 um (L), 1.5 um (W) and 15 um (T)};
torsional spring 190: {150 um (L), 1.5 um (W) and 15 um (T)}.

Some or all of the entire structure used to make the mirror 152, the vertical actuator 198 and the 2D rotational T-shaped hinge 200 is connected to ground, and behaves like an electrode. For example if these components are made of doped silicon they become conductive. In this way, by applying a voltage to an electrode (for example electrode 194) the mirror behaves as the second electrode without the need to deposit a second designated electrode.

In some embodiments, in order to provide the most flexible control over the rotation over the additional rotational axis (θz), a support structure is provided on top of the vertical actuator 198 with an additional electrode so that a force could be applied to cause the vertical actuator 198 to move upwards. In some applications, this additional degree of freedom may not be required.

The embodiment of FIG. 11 features the use of electrodes through which electrostatic forces can be applied to control rotation in the two rotational axes. More generally, any other type of force could also be employed in either or both of these rotational axes. For example thermal, magnetic, thermal bimorph or piezo-electric forces can be employed to achieve the required rotation and control.

The combination of the 2D rotational T-shaped hinge, a mirror, and a moving vertical actuator connected to the 2D rotational T-shaped hinge results in a fully functional 2D MEMS mirror. The vertical actuator can be deflected in either up or down directions depending on the arrangement of electrodes or force application, thus making the mirror rotate about the first axis θz in either direction. For most electrostatic applications, the vertical actuator can be deflected downwards only to reduce the number of I/O's and control complexity.

Like the embodiment of FIG. 4A, the embodiment shown in FIG. 11 can be used in a linear and a 2-dimensional array of N×M such mirror devices.

In the embodiments discussed above, the torsional actuation of the mirror is achieved by actuators provided on or as part of the mirror, for example, the mirror 72 behaves like an electrode in the embodiment shown in FIG. 4A, upon which electrostatic forces are directly applied via the electrodes 84,85. These embodiments provide a minimal mechanical coupling between the two rotational axes, however there is still some electro-mechanical coupling due to the fact that rotation in at least one of the rotational axes is caused by the direct application of electrostatic force to the mirror. Another embodiment of the invention effects torsional deflection of the mirror through independent torsional actuation, thereby providing a greater electro-mechanical decoupling of the two rotational axes. FIGS. 9A-D show embodiments of the invention comprising a mirror 132, a rotation actuator 110 for effecting torsional actuation of the mirror 132 and a cantilever actuator 80 for effecting vertical actuation of the mirror 132 as in previous embodiments.

Figure 9A:
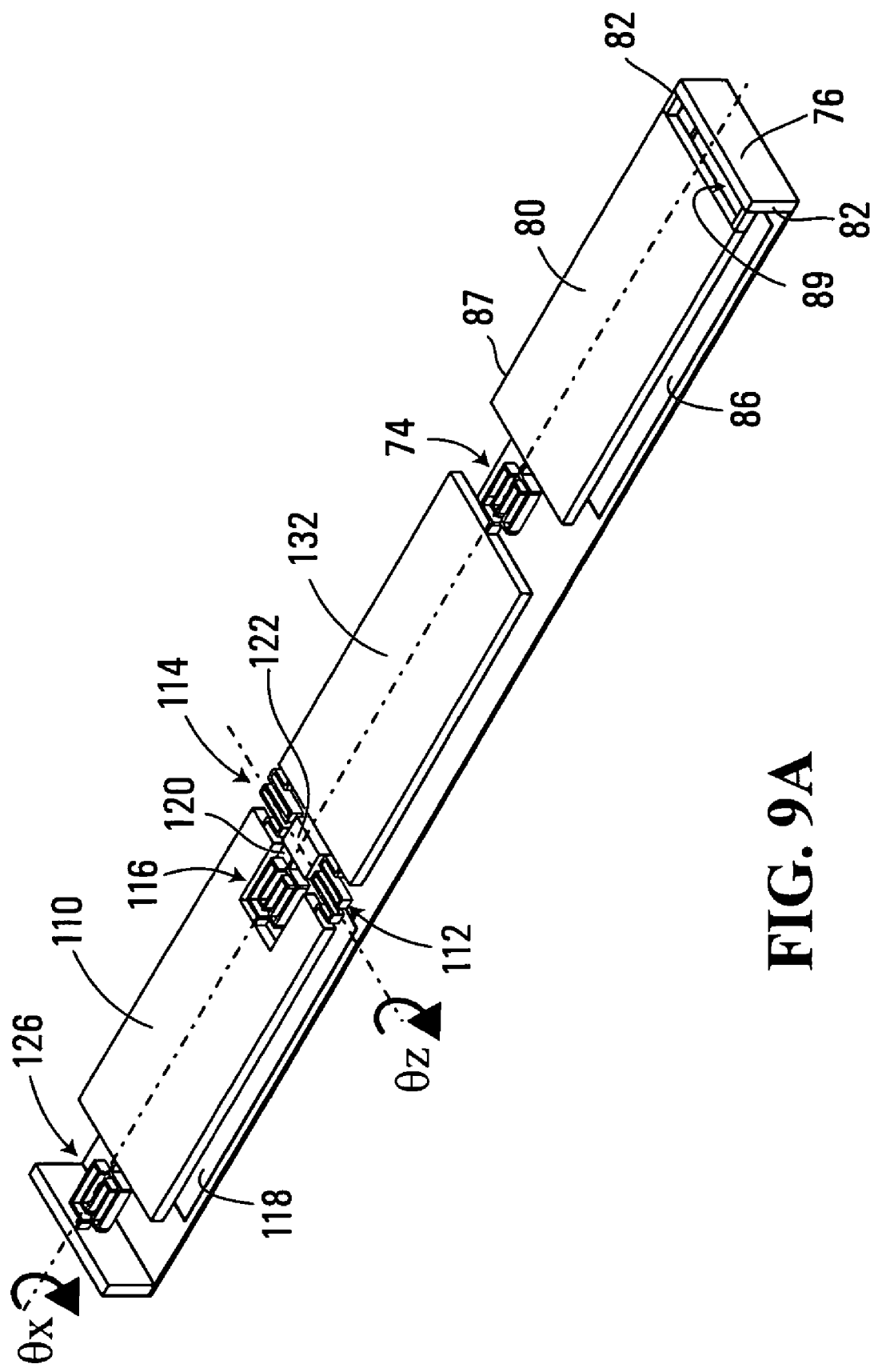
FIG. 9A is a view of a mirror with two bending springs, a rotation actuator and movable cantilever mounting system provided by another embodiment of the invention.

In the embodiment shown in FIG. 9A, a first end of a mirror 132 is connected to an end 87 of a cantilever 80 through a first torsional spring 74 in the same manner as the connection between the mirror 72 and the cantilever 80 through the 1D rotational articulated hinge 74 shown in FIG. 4A. As a result, the vertical deflection of the mirror 132 shown in FIG. 9A occurs by the same mechanism as the vertical deflection of the mirror 72 shown in FIG. 4A, i.e. the actuation of the cantilever 80. The second end of the mirror 132 is connected to a first end of a rotation actuator 110 by two bending springs 112, 114. In the illustrated example the bending springs are articulated, but more generally any spring structure can be employed. The two bending springs 112,114 are respectively connected to the first end of the rotation actuator 110 on either side of a recess located in the middle of the first end of the rotation actuator 110. The first end of the rotation actuator 110 is also connected to an anchor post 122 that is part of the support structure 76 and is located between the first end of the rotation actuator 110 and the second end of the mirror 132. The first end of the rotation actuator 110 is connected to the anchor post 122 through a second torsional spring 116 that is located in the recess of the rotation actuator 110. A second end of the rotation actuator 110 is connected to the support structure 76 by a third torsional spring 126. In the illustrated example, the rotation actuator 110 includes the recess in which the second torsional spring 116 is located. Recessing the second torsional spring 116 in the first end of the rotation actuator 110 reduces the distance between the first end of the rotation actuator 110 and the second end of the mirror 132. Alternatively, the rotation actuator may not include a recess.

In some embodiments, the torsional springs 74,116,126 are 1D rotational articulated hinges. In general, the torsional springs 74,116,126 may be implemented by any structure that provides torsional flexibility.

To control rotation in a torsional axis (θx), electrodes 118, 120 are provided below the rotation actuator 110, which operate similar to the electrodes 38,40 of FIG. 1A. This allows the control of the rotation of the rotation actuator 110 about the main torsional axis θx. Because the rotation actuator 110 is connected to the mirror 132 by the two bending springs 112,114, actuation and torsional rotation of the rotation actuator 110 will cause a torsional rotation of the mirror 132 about the main torsional axis θx. However, due to the fact that the first end of the rotation actuator 110 is connected to the anchor post 122 by the second torsional spring 116, and the second end of the rotation actuator 110 is connected to the support structure 76 by the third torsional spring 126, the rotational actuation of the rotation actuator 110 will essentially cause no vertical deflection of the rotation actuator 110, and hence will cause essentially no vertical deflection of the mirror 132.

The structure and operation of the cantilever 80 shown in FIG. 9A are the same as that of the cantilever 80 shown in FIG. 4A. An electrode 86 beneath the cantilever 80 controls the up and down motion of the end 87 of the cantilever 80 most remote from the connection 82 to the support structure 76. In the illustrated example, the additional rotational axis (θz) is located midway between the first end of the rotation actuator 110 and the second end of the mirror 132. More generally, the additional rotational axis (θz) may be located at any point between the first end of the rotation actuator 110 and the second end of the mirror 132. The up and down motion of the end 87 of the cantilever 80 causes rotation of the mirror 132 about the additional rotational axis (θz), thus making it possible to tilt the mirror in both axes θx ,θz.

Figure 9B:
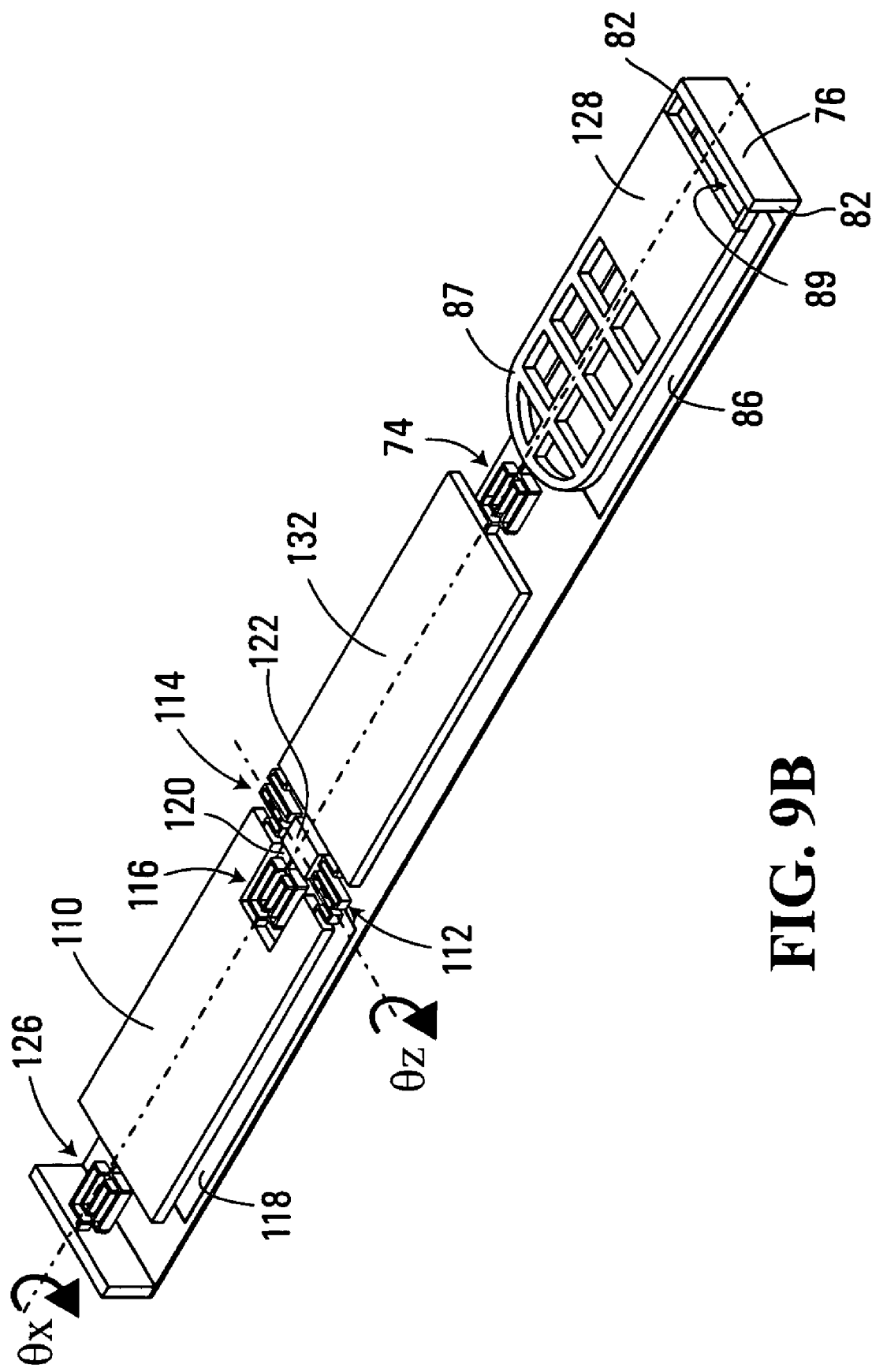
FIG. 9B is a view of a mirror with two bending springs, a rotation actuator and movable cantilever mounting system provided by another embodiment of the invention.

In some embodiments, the cantilever 80 is designed with a length and mass to achieve design parameters such as resonant frequencies. The inclusion of holes can be used to decrease the mass of the cantilever as part of this design effort. The embodiment shown in FIG. 9B includes a structure similar to that of FIG. 9A except that the cantilever 80 shown in FIG. 9A has been replaced with a cantilever 128 that has an end portion furthest from its mounting point 82 that is rounded and perforated with holes. Actuation of the cantilever 128 shown in FIG. 9B is accomplished in the same manner as the actuation of the cantilever 80 shown in FIG. 9A.

In the illustrated example, the end portion of the cantilever is rounded and perforated with a grid of evenly spaced rectangular holes. More generally, the end portion may be any shape and may include any number of holes of any shape arranged in any manner, including a single hole.

Figure 9C:
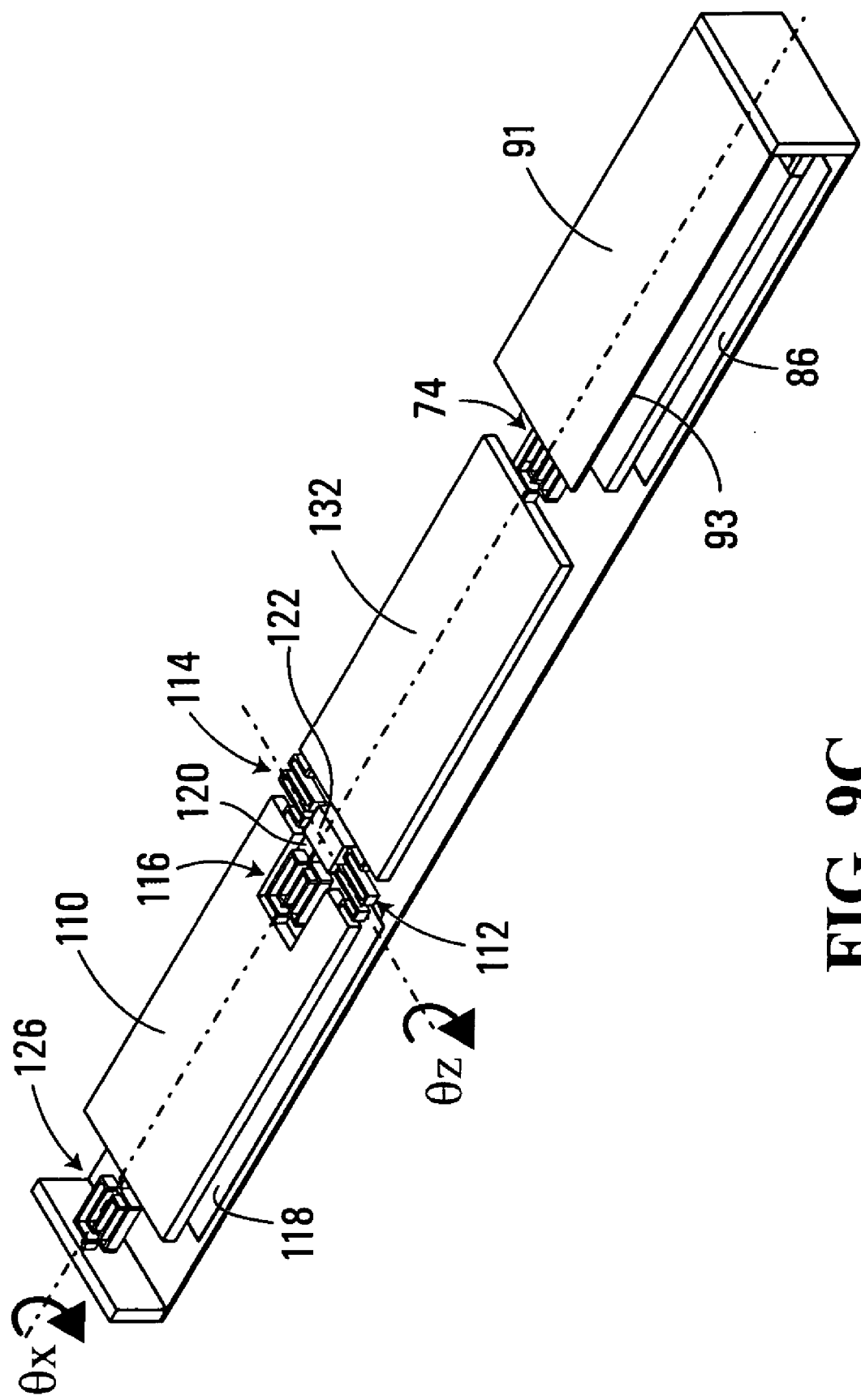
FIG. 9C is a view of a mirror with two bending springs, a rotation actuator and movable cantilever mounting system provided by still another embodiment of the invention.

In some embodiments, in order to provide the most flexible control over the rotation about the additional rotational axis (θz), an additional support structure is provided on top of the cantilever with an additional electrode so that a force could be applied to cause the end of the cantilever to move upwards. An example of this embodiment is shown in FIG. 9C, which is very similar to FIG. 9A, with the exception of the additional support structure 91 and additional electrode 93, which allow an electrostatic force to be applied to the cantilever structure to move it both up and down. An additional support structure and an additional electrode could be added in the same manner to the embodiment shown in FIG. 9B in order to move the cantilever 128 both up and down. In some applications, this additional degree of freedom may not be required.

Figure 9D:
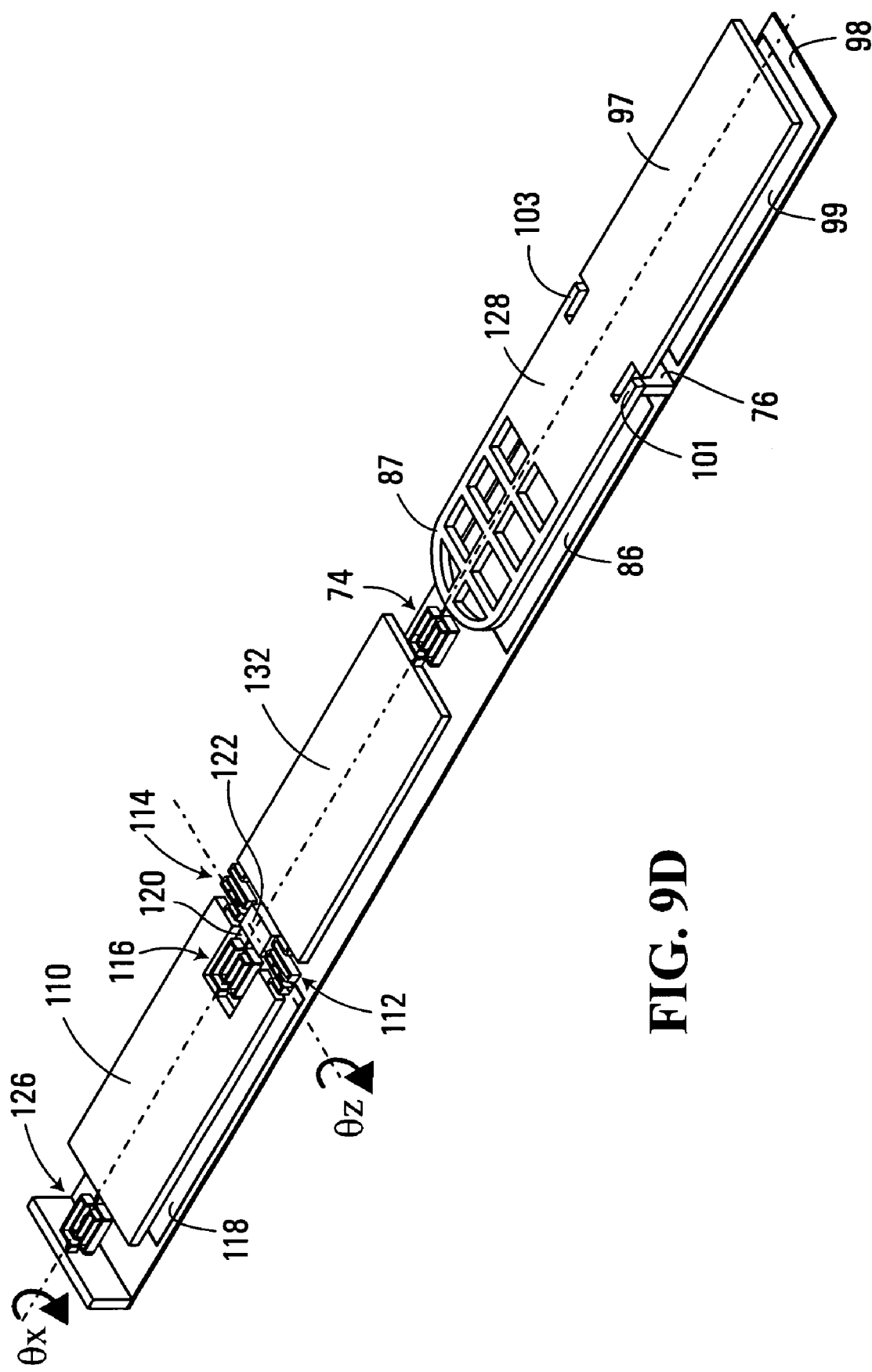
FIG. 9D is a view of a mirror with bending springs, a rotation actuator and movable cantilever mounting system provided by yet another embodiment of the invention.

Another embodiment of the invention that provides for both up and down movement of a cantilever will now be described with reference to FIG. 9D. This embodiment is very similar to that of FIG. 9B. Similar to the rigid extension 97 of the cantilever 80 shown in FIG. 4D, this embodiment includes a rigid extension 97 of the cantilever 128 mounted over further support structure 98 to which an additional electrode 99 is affixed. The cantilever 128 and the rigid extension 97 together pivot about mounting points 101,103 to the support structure 76.

In operation, with this arrangement an electrostatic force can be applied between the electrode 86 and cantilever 128 to move point 87 in a downward direction. Similarly, an electrostatic force can be applied between electrode 99 and the rigid extension 97 to cause the end 87 of cantilever 128 to move upwards. Thus, the arrangement of FIG. 9D provides the flexibility that both upward and downward mobility in the second axis of rotation (θz) is possible. The attachment of the cantilever structure composed of combined elements 128 and 97 to the support structure can either be pivotable, or rigid. In the event of a rigid connection, the support structure 76 would need to have some flexibility to allow the upward and downward motion of the cantilever 128 and the rigid extension 97 on either side of support structure 76.

In the illustrated example, the cantilever 128 is shown perforated with holes and is rounded at the end 87 furthest from its mounting points 101,103 to the support structure 76. In general the cantilever may be any structure that can be connected to the support structure and with an end furthest from the connection to the support structure that can be connected to a torsional spring and vertically deflected.

In some embodiments, the cantilever is a solid rectangular cantilever like the rectangular cantilever 80 shown in FIG. 9A.

In the illustrated examples of FIGS. 9A-9D, the torsional springs 74,116,126 are of the same type as the 1D rotational articulated hinge 74 shown in FIG. 4A. The bending springs 112,114 also comprise articulated beams.

In some embodiments, each bending spring comprises a silicon beam with high aspect ratio thickness to width.

In some embodiments, each bending spring is made from a single unitary piece of silicon. In other embodiments, the arrangement is made of a deposited material such as polysilicon, Silicon Nitride, Silicon dioxide, and Metallic depositable materials. Other materials may be employed. In some embodiments the beams of the bending springs are made of multiple materials, for example in a layered structure.

The bending springs 112,114 allow rotation along the additional rotational axis ($\theta z$) by stretching when the first end of the mirror 132 is vertically deflected by the actuation of the cantilever. In some embodiments the rotation actuator 110 is simply another piece of silicon.

Any suitable dimensions for the torsional springs and the bending springs shown in FIGS. 9A-9D may be employed. The beams of the torsional springs and the bending springs may include any number of articulations. The more articulations included in a given spring, the less will be the required force to cause bending in the case of the bending springs or rotation about the respective axis in the case of the torsional springs.

Like the embodiments of FIGS. 4A-4D, the embodiments of FIGS. 9A-9D have employed the use of electrodes through which electrostatic forces can be applied to control rotation in the two rotational axes. More generally, any other type of force could also be employed in either or both of these rotational axes. For example thermal, magnetic, thermal bimorph or piezo-electric forces can be employed to achieve the required rotation and control.

This combination of a rotation actuator, torsional springs, a mirror, bending springs and a movable cantilever results in a fully functional 2D MEMS mirror. The rotation actuator can be rotationally deflected in either direction about the primary axis of rotation $\theta x$ causing the mirror to be rotationally deflected in either direction about the primary axis of rotation $\theta x$. The cantilever can be deflected in either up or down directions depending on the arrangement of electrodes or force application, thus making the mirror rotate about the second axis $\theta z$ in either direction. For most electrostatic applications, the cantilever can be deflected downwards only to reduce the number of I/O's and control complexity.

Like the embodiments shown in FIGS. 4A-4D, the embodiments shown in FIGS. 9A-9D can also be used to construct a linear array of mirrors with minimal spacing between mirrors by placing a number of the embodiments side by side. An arbitrary number could be included in such an array. Another embodiment provides a 2-dimensional array of N×M such mirror devices.

As stated above, the embodiments shown in FIGS. 9A-9D provide an even greater decoupling of the two tilt axes of the mirror than the embodiments shown in FIGS. 4A-4D. The device structures shown in FIGS. 9A-9D can be used in any number of applications. They can be used as a single mirror for any appropriate application of a single or multi-array configuration. The arrangements achieve a high fill factor for mirror arrays (that is the spacing between two consecutive mirrors in an array is minimized) and is very simple to fabricate. The spacing between two mirrors can be as low as few microns or as limited by microfabrication processes.

The device can be fabricated with existing MEMS fabrication processes. A few of the suitable processes that are commercially available are "Optical IMEMS"® from Analog Devices Inc (see Thor Juneau, et al, 2003, 'Single-Chip 1×84 MEMS Mirror Array For Optical Telecommunication Applications', Proceeding of SPIE, MOEMS and Miniaturized Systems III, 27-29 January 2003, Vol. 4983, pp. 53-64.), SOI MUMPS *(http://www.memsrus.com/figs/soimumps.pdf)* from Cronos (MEMScAP subsidiary). A custom process can also be put together to fabricate the device.

It is to be understood that in a system application, a control system would be provided to control the rotation of the mirror in the two degrees of freedom. This would be controlled through the proper application of the forces through the various electrodes. The control system will preferably be an open loop system with a voltage look-up table for various tilt position or a closed loop system with capacitance or optical sensing.

The mirrors in the above employed embodiments need to have a reflective coating, for example of Au, Al, or Cu in one of more layers. The mirrors are used to perform the main switching of beams of light. However, it is to be understood that the cantilever portion could also have a reflective coating. The cantilever and/or mirror components could be used for capacitive or optical sensing. For example, the mirror components might be used for switching, while the cantilever components are used to perform sensing with signals generated to perform feedback control over the orientation of the mirrors in the additional rotational axis ($\theta z$).

While MEMS as a whole usually include electrical circuitry, devices for use in such systems may not all include such circuitry, but are still commonly referred to as MEMS devices. The 2D rotational articulated hinge of FIG. 3A is an example of this.

Numerous modifications and variations of the present invention are possible in light of the above teachings. It is therefore to be understood that within the scope of the appended claims, the invention may be practiced otherwise than as specifically described herein.

We claim:

1. A micro-electro-mechanical-system (MEMS) mirror device, comprising:

a mirror having a 2-dimensional rotational T-shaped hinge at a first end;

a support structure connected to the mirror through the 2-dimensional rotational T-shaped hinge;

whereby the mirror is rotatable about a first axis of rotation and a second torsional axis of rotation perpendicular to the first axis of rotation; and wherein the 2-dimensional rotational T-shaped hinge comprises:

a first torsional spring having a first mounting point at a first end connected to the support structure and having a second end;

a second torsional spring having a second mounting point at a first end connected to the support structure and having a second end, the second end of the first torsional spring being connected to the second end of the second torsional spring;

a third torsional spring having a first end connected to the second ends of the first and second torsional springs and having a second end connected to the first end of the mirror;

whereby the first torsional spring and the second torsional spring define the first axis of rotation between the first and second mounting points, and the third torsional spring defines the second torsional axis of rotation perpendicular to the first axis of rotation.

2. A device according to claim 1 wherein each torsional spring comprises a respective beam having a large thickness to width aspect ratio.

3. A device according to claim 1 wherein each torsional spring comprises a respective beam having a large thickness to width aspect ratio, the beam being formed of a material or materials selected from a group consisting of Silicon, Polysilicon, Silicon Nitride, Silicon dioxide, and metallic depositable materials.

4. A device according to claim 2 wherein the beams are formed of a unitary construction.

5. A device according to claim 2 wherein the beams and the mirror are formed of a unitary construction.

6. A device according to claim 2 wherein the beams comprise articulated beams.

7. A device according to claim 1 in which the mirror has an angular range of motion at least 0.3 degrees in each axis.

8. A device according to claim 1 further comprising electrodes for applying electrostatic force to the mirror so as to move the mirror in at least one of the first and second axes of rotation.

9. A device according to claim 8 wherein the electrodes comprise two electrodes each for applying a respective electrostatic force to the mirror so as to move the mirror in a respective direction in the second axis of rotation, and at least one electrode for applying electrostatic force to the mirror so as to move the mirror in the first rotational axis.

10. A device according to claim 9 wherein the at least one electrode comprises at least one electrode mounted on the support structure proximal at least one of the first end of the mirror and a second end of the mirror opposite the first end of the mirror for applying a respective electrostatic force to the mirror so as to move the mirror in the first rotational axis.

11. A device according to claim 1 further comprising a vertical actuator connected to the 2-dimensional rotational T-shaped hinge through a rigid connection; whereby movement of the vertical actuator causes rotation of the mirror in the first axis of rotation.

12. A device according to claim 11 wherein each torsional spring comprises a respective beam having a large thickness to width aspect ratio.

13. A device according to claim 12 wherein the beams are formed of a unitary construction.

14. A device according to claim 12 wherein the beams, the vertical actuator and the mirror are formed of a unitary construction.

15. A device according to claim 12 wherein the beams comprise articulated beams.

16. A device according to claim 11 wherein each torsional spring comprises a respective beam having a large thickness to width aspect ratio, the beam being formed of a material or materials selected from a group consisting of Silicon, Polysilicon, Silicon Nitride, Silicon dioxide, and metallic depositable materials.

17. A device according to claim 11 in which the mirror has an angular range of motion at least 0.3 degrees in each axis.

18. A device according to claim 11 further comprising electrodes for applying electrostatic force to the mirror so as to move the mirror in at least one of the first and second axes of rotation.

19. A device according to claim 18 wherein the electrodes comprise two electrodes each for applying a respective electrostatic force to the mirror so as to move the mirror in a respective direction in the second axis of rotation, and at least one electrode for applying electrostatic force to the mirror so as to move the mirror in the first rotational axis.

20. A device according to claim 19 further comprising at least one electrode mounted on the support structure beneath the vertical actuator for applying a respective electrostatic force to the vertical actuator so as to move the mirror in the first rotational axis.

21. A device according to claim 1 further comprising a flexible connection that is connected to the support structure and to a second end of the mirror that is opposite the first end of the mirror.

22. A device according to claim 21 wherein the flexible connection comprises a torsional spring and at least one bending spring.

23. A device according to claim 22 wherein each torsional spring comprises a respective beam having a large thickness to width aspect ratio.

24. A device according to claim 23 wherein the beams are formed of a unitary construction.

25. A device according to claim 23 wherein the beams, the bending spring and the mirror are formed of a unitary construction.

26. A device according to claim 23 wherein the beams comprise articulated beams.

27. A device according to claim 22 wherein each torsional spring comprises a respective beam having a large thickness to width aspect ratio, the beam being formed of a material or materials selected from a group consisting of Silicon, Polysilicon, Silicon Nitride, Silicon dioxide, and metallic depositable materials.

28. A device according to claim 22 wherein the at least one bending spring comprises a rectangular spiral spring.

29. A device according to claim 22 wherein the at least one bending spring comprises a connected concentric spiral beam spring comprising connected concentric beams, wherein adjacent concentric beams are connected together at only one point.

30. A device according to claim 29 wherein the connected concentric spiral beam spring is circular.

31. A device according to claim 30 wherein a center of the connected concentric spiral beam spring is offset from the second torsional axis of rotation.

32. A device according to claim 29 wherein the connected concentric spiral beam spring is rectangular.

33. A device according to claim 22 wherein the at least one bending spring comprises a first connected concentric spiral beam spring and a second connected concentric spiral beam spring each comprising connected concentric beams, wherein adjacent concentric beams are connected together at only one point, and wherein respective centers of the first and the second connected concentric spiral beam springs are located on opposite sides of the second torsional axis of rotation and are equidistant to any point on the second torsional axis of rotation.

34. A device according to claim 33 wherein the first and the second connected concentric spiral beam springs are circular.

35. A device according to claim 33 wherein the at least one bending spring comprises a pair of articulated beam springs each comprising a plurality of partial sections of concentric circles defining a sector of a circle wherein adjacent sections are alternatingly connected at only one end to an adjacent section.

36. A device according to claim 22 wherein the at least one bending spring comprises a pair of S-shaped bending springs.

37. A device according to claim 22 wherein the at least one bending spring comprises a pair of articulated beam springs each with a medial point and connected at the medial point.

38. A device according to claim 21 in which the mirror has an angular range of motion at least 0.3 degrees in each axis.

39. A device according to claim 21 further comprising electrodes for applying electrostatic force to the mirror so as to move the mirror in at least one of the first and second axes of rotation.

40. A device according to claim 39 wherein the electrodes comprise two electrodes each for applying a respective electrostatic force to the mirror so as to move the mirror in a respective direction in the second axis of rotation, and at least one electrode for applying electrostatic force to the mirror so as to move the mirror in the first rotational axis.

41. A device according to claim 21 further comprising at least one restraining support for limiting movement of the mirror.

42. A device according to claim 21 wherein the flexible connection comprises a T-shaped hinge comprising one torsional spring and two bending springs.

43. A device according to claim 21 wherein the flexible connection comprises a torsional spring and a bending spring comprising a series of connected rectangles of diminishing size.

44. A device according to claim 1 in which the mirror is made of silicon plated with a metal.

45. A device according to claim 44 wherein the metal comprises Au, Al or Cu layers.

46. A plurality N of devices according to claim 1 arranged side by side to form a l×N MEMs array, where N≧2.

47. A plurality N×M of devices according to claim 1 arranged in N rows of M devices thereby forming an N×M MEMs array, where N≧2 and M≧2.

48. A device according to claim 1 wherein the mirror is used for optical switching.

49. An optical switch, comprising: a plurality of optical ports; a plurality of devices according to claim 1 each adapted to switch light between a respective pair of the optical ports.

50. A device according to claim 1, further comprising a movable cantilever connected to a second end of the mirror that is opposite the first end of the mirror through a fourth torsional spring and to the support structure; whereby movement of the movable cantilever causes rotation of the mirror in the first axis of rotation; and wherein the movable cantilever is used for capacitive, magnetic or optical sensing of mirror position.

* * * * *

UNITED STATES PATENT AND TRADEMARK OFFICE
CERTIFICATE OF CORRECTION

PATENT NO.       : 7,443,569 B2                                                       Page 1 of 1
APPLICATION NO.  : 11/505378
DATED            : October 28, 2008
INVENTOR(S)      : Mala et al.

It is certified that error appears in the above-identified patent and that said Letters Patent is hereby corrected as shown below:

Col. 2, line 29, the following paragraph should be inserted:

-- According to one broad aspect, the invention provides a micro-electro-mechanical-system (MEMS) mirror device, comprising: a mirror having a 2-dimensional rotational T-shaped hinge at a first end; a support structure connected to the mirror through the 2-dimensional rotational T-shaped hinge; whereby the mirror is rotatable about a first axis of rotation and a second torsional axis of rotation perpendicular to the first axis of rotation; and wherein the 2-dimensional rotational T-shaped hinge comprises: a first torsional spring having a first mounting point at a first end connected to the support structure and having a second end; a second torsional spring having a second mounting point at a first end connected to the support structure and having a second end, the second end of the first torsional spring being connected to the second end of the second torsional spring; a third torsional spring having a first end connected to the second ends of the first and second torsional springs and having a second end connected to the first end of the mirror; whereby the first torsional spring and the second torsional spring define the first axis of rotation between the first and second mounting points, and the third torsional spring defines the second torsional axis of rotation perpendicular to the first axis of rotation. --

Signed and Sealed this

Sixteenth Day of March, 2010

David J. Kappos
*Director of the United States Patent and Trademark Office*